US012689333B2

(12) United States Patent
Peng et al.

(10) Patent No.: US 12,689,333 B2
(45) Date of Patent: Jul. 21, 2026

(54) PROTECTION CIRCUIT AND METHOD FOR POWER AMPLIFIER

(71) Applicant: SMARTER MICROELECTRONICS (GUANG ZHOU) CO., LTD., Guangzhou (CN)

(72) Inventors: Yangyang Peng, Guangzhou (CN); Yang Hou, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 493 days.

(21) Appl. No.: 18/468,711

(22) Filed: Sep. 17, 2023

(65) Prior Publication Data

US 2024/0007057 A1 Jan. 4, 2024

Related U.S. Application Data

(63) Continuation of application No. PCT/CN2022/133798, filed on Nov. 23, 2022.

(30) Foreign Application Priority Data

Nov. 23, 2021 (CN) .......................... 202111396620.8

(51) Int. Cl.
*H03F 1/52* (2006.01)
*H03F 1/56* (2006.01)
*H03F 3/24* (2006.01)

(52) U.S. Cl.
CPC .................. *H03F 1/52* (2013.01); *H03F 1/56* (2013.01); *H03F 3/245* (2013.01); *H03F 2200/462* (2013.01); *H03F 2200/471* (2013.01)

(58) Field of Classification Search
CPC .......................................................... H03F 1/52
USPC ............................................... 330/298, 207 P
See application file for complete search history.

(56) References Cited

U.S. PATENT DOCUMENTS

| | | | | |
|---|---|---|---|---|
| 6,580,321 B1 * | 6/2003 | Arell | ....................... | H03F 3/191 |
| | | | | 327/309 |
| 7,482,878 B2 * | 1/2009 | Nakai | ..................... | H03F 3/191 |
| | | | | 330/310 |
| 7,839,218 B2 * | 11/2010 | Shimamoto | ............... | H03F 3/24 |
| | | | | 330/297 |
| 8,994,455 B2 * | 3/2015 | Kim | .......................... | H03F 3/19 |
| | | | | 330/207 P |

(Continued)

*Primary Examiner* — Henry Choe
(74) *Attorney, Agent, or Firm* — Syncoda LLC; Feng Ma

(57) ABSTRACT

A protection circuit for the power amplifier includes a detection circuit, a controller and an input impedance adjustment circuit. The detection circuit is provided with an input end connected to the power amplifier and an output end connected to an input end of the controller, and is configured to detect an operation electrical signal of the power amplifier and generate a trigger electrical signal. The controller is configured to generate a first control signal and a second control signal, the first control signal is configured to control a bias current or bias voltage of the power amplifier to reduce or recover a gain of the power amplifier, and the second control signal is configured to adjust characteristic parameters of the input impedance adjustment circuit. The input impedance adjustment circuit is configured to decrease or increase input power of the power amplifier in response to the second control signal.

15 Claims, 14 Drawing Sheets

(56)         References Cited

U.S. PATENT DOCUMENTS

2015/0038092 A1 *   2/2015  Andrys  ................. H03F 1/0233
                                            327/318

* cited by examiner

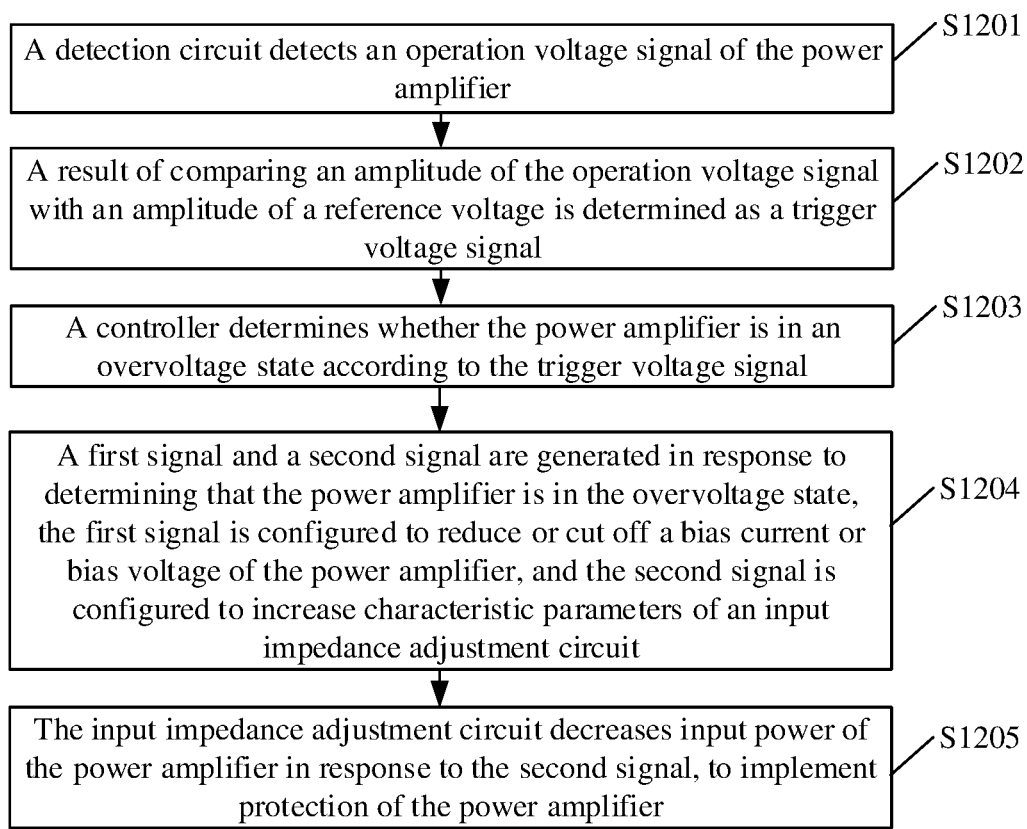

A detection circuit detects an operation voltage signal of the power amplifier    S1201

A result of comparing an amplitude of the operation voltage signal with an amplitude of a reference voltage is determined as a trigger voltage signal    S1202

A controller determines whether the power amplifier is in an overvoltage state according to the trigger voltage signal    S1203

A first signal and a second signal are generated in response to determining that the power amplifier is in the overvoltage state, the first signal is configured to reduce or cut off a bias current or bias voltage of the power amplifier, and the second signal is configured to increase characteristic parameters of an input impedance adjustment circuit    S1204

The input impedance adjustment circuit decreases input power of the power amplifier in response to the second signal, to implement protection of the power amplifier    S1205

FIG. 12

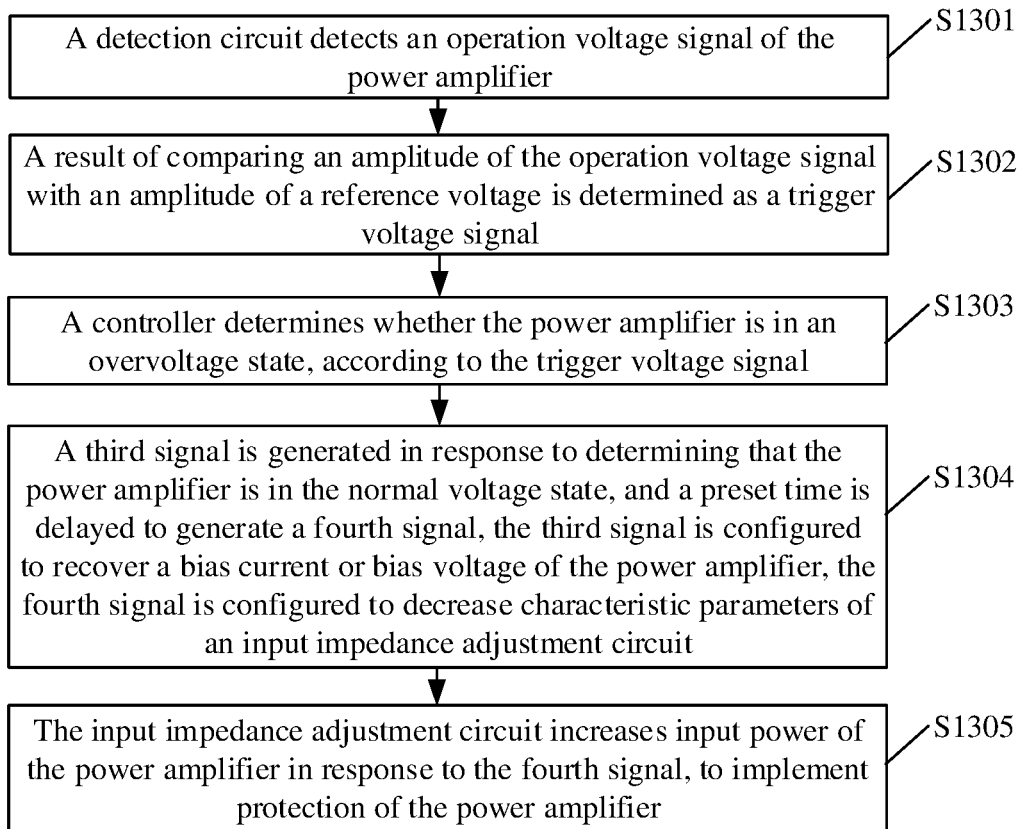

A detection circuit detects an operation voltage signal of the power amplifier — S1301

A result of comparing an amplitude of the operation voltage signal with an amplitude of a reference voltage is determined as a trigger voltage signal — S1302

A controller determines whether the power amplifier is in an overvoltage state, according to the trigger voltage signal — S1303

A third signal is generated in response to determining that the power amplifier is in the normal voltage state, and a preset time is delayed to generate a fourth signal, the third signal is configured to recover a bias current or bias voltage of the power amplifier, the fourth signal is configured to decrease characteristic parameters of an input impedance adjustment circuit — S1304

The input impedance adjustment circuit increases input power of the power amplifier in response to the fourth signal, to implement protection of the power amplifier — S1305

FIG. 13

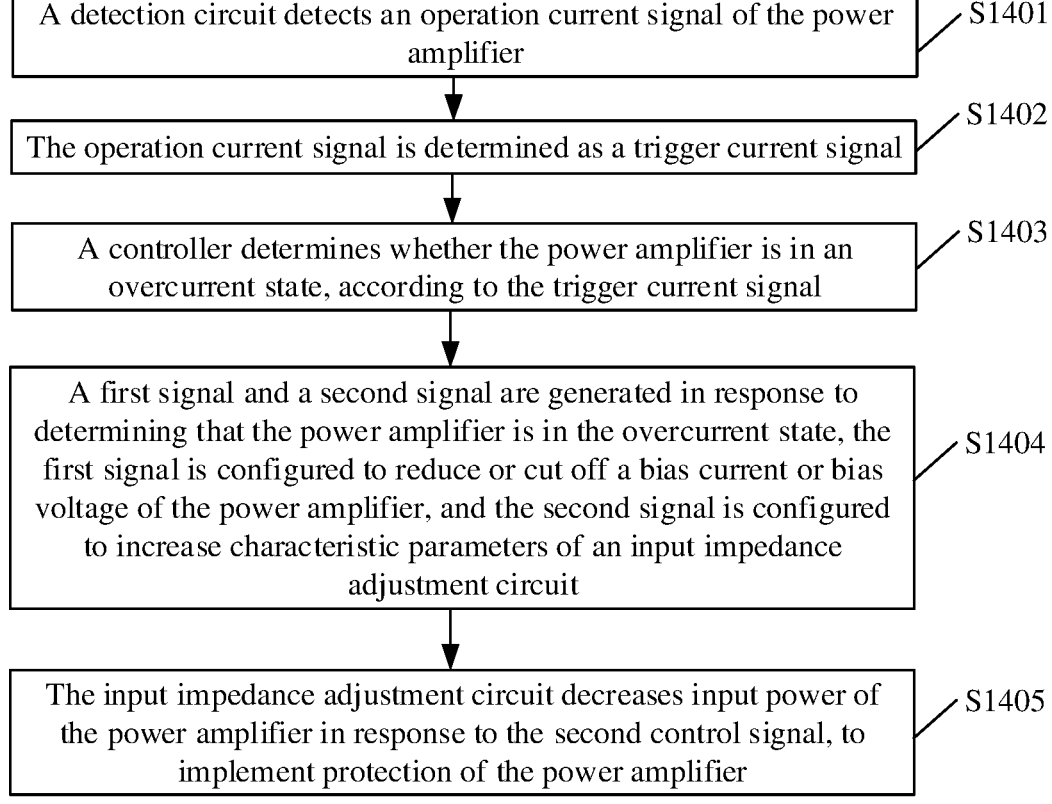

A detection circuit detects an operation current signal of the power amplifier — S1401

The operation current signal is determined as a trigger current signal — S1402

A controller determines whether the power amplifier is in an overcurrent state, according to the trigger current signal — S1403

A first signal and a second signal are generated in response to determining that the power amplifier is in the overcurrent state, the first signal is configured to reduce or cut off a bias current or bias voltage of the power amplifier, and the second signal is configured to increase characteristic parameters of an input impedance adjustment circuit — S1404

The input impedance adjustment circuit decreases input power of the power amplifier in response to the second control signal, to implement protection of the power amplifier — S1405

FIG.14

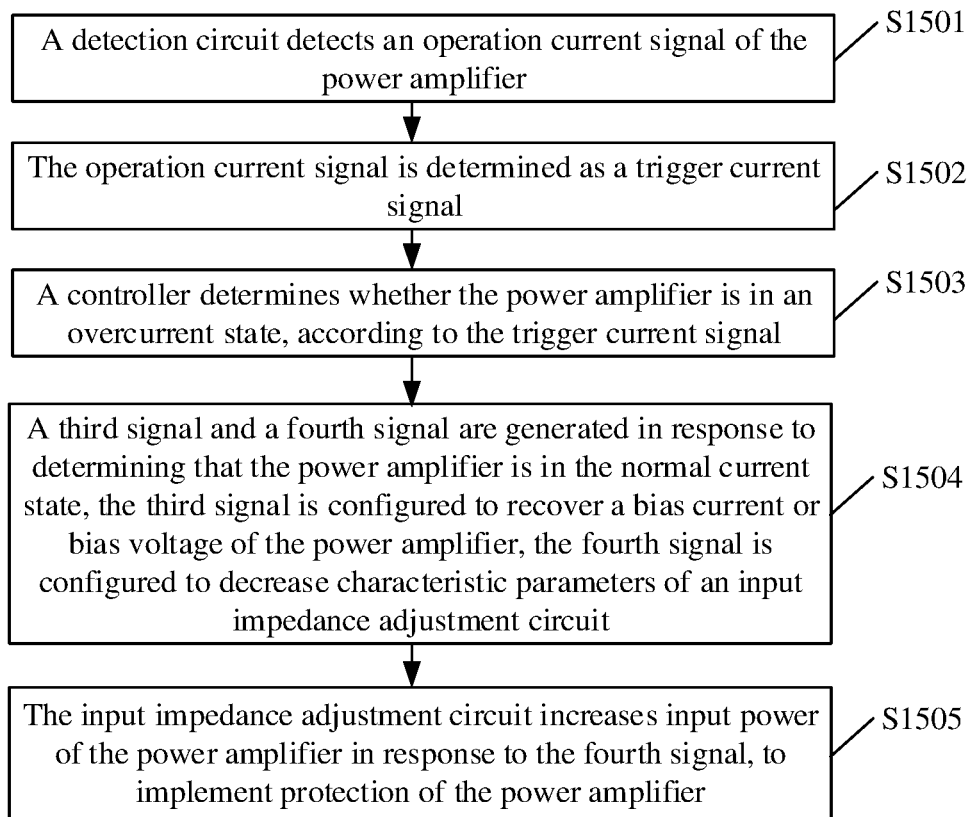

A detection circuit detects an operation current signal of the power amplifier — S1501

The operation current signal is determined as a trigger current signal — S1502

A controller determines whether the power amplifier is in an overcurrent state, according to the trigger current signal — S1503

A third signal and a fourth signal are generated in response to determining that the power amplifier is in the normal current state, the third signal is configured to recover a bias current or bias voltage of the power amplifier, the fourth signal is configured to decrease characteristic parameters of an input impedance adjustment circuit — S1504

The input impedance adjustment circuit increases input power of the power amplifier in response to the fourth signal, to implement protection of the power amplifier — S1505

FIG. 15

PROTECTION CIRCUIT AND METHOD FOR POWER AMPLIFIER

CROSS-REFERENCE TO RELATED APPLICATIONS

This is a continuation of International Application No. PCT/CN2022/133798 filed on Nov. 23, 2022, which claims priority to Chinese Patent Application No. 202111396620.8 filed on Nov. 23, 2021. The disclosures of the above-referenced applications are hereby incorporated by reference in their entirety.

BACKGROUND

An overcurrent protection circuit and overvoltage protection circuit for a power amplifier may reduce a gain of the power amplifier or cut off the power amplifier, by reducing or closing a bias current of the power amplifier after protection is enabled.

SUMMARY

The disclosure relates to, but is not limited to, a protection circuit and method for a power amplifier.

It is desirable for embodiments of the disclosure to provide a protection circuit and method for a power amplifier.

According to a first aspect, an embodiment of the disclosure provides a protection circuit for a power amplifier, including a detection circuit, a controller and an input impedance adjustment circuit.

The detection circuit is provided with an input end connected to the power amplifier and an output end connected to an input end of the controller, and is configured to detect an operation electrical signal of the power amplifier and generate a trigger electrical signal based on the operation electrical signal.

A first output end of the controller is connected to a base or a gate or a bias circuit of the power amplifier, and a second output end of the controller is connected to a control input end of the input impedance adjustment circuit.

An output end of the input impedance adjustment circuit is connected to an input end of the power amplifier.

The controller is configured to generate a first control signal and a second control signal based on the trigger electrical signal, the first control signal is configured to control a bias current or bias voltage of the power amplifier to reduce or recover a gain of the power amplifier, and the second control signal is configured to adjust characteristic parameters of the input impedance adjustment circuit.

The input impedance adjustment circuit is configured to decrease or increase input power of the power amplifier in response to the second control signal.

According to a second aspect, an embodiment of the disclosure provides a protection method for a power amplifier, applied to the above protection circuit for the power amplifier, the protection method includes the following operations.

A detection circuit detects an operation electrical signal of the power amplifier, and generates a trigger electrical signal based on the operation electrical signal.

A controller generates a first control signal and a second control signal based on the trigger electrical signal, the first control signal is configured to control a bias current or bias voltage of the power amplifier to reduce or recover a gain of the power amplifier, and the second control signal is configured to adjust characteristic parameters of an input impedance adjustment circuit.

The input impedance adjustment circuit decreases or increases input power of the power amplifier in response to the second control signal, to implement protection of the power amplifier.

In the embodiments of the disclosure, since the protection circuit for the power amplifier includes the input impedance adjustment circuit connected to a transceiver and a power input end of the power amplifier, when voltage protection or current protection is removed, the characteristic parameters of the input impedance adjustment circuit may be adjusted in a process of establishing bias of the power amplifier, to decrease an input power signal and reduce a problem where the power amplifier is burnt out due to a large input power at the moment of recovering establishment of a path.

It should be understood that the above general descriptions and the following detailed descriptions are only exemplary and explanatory, rather than limiting the disclosure.

BRIEF DESCRIPTION OF THE DRAWINGS

Drawings here are incorporated into the description and form a part of the description. These drawings show embodiments in accordance with the disclosure and are intended to explain technical solutions of the disclosure, together with the description.

FIG. 12 is a schematic flowchart of implementation of another protection method for a power amplifier according to an embodiment of the disclosure.

FIG. 13 is a schematic flowchart of implementation of still another protection method for a power amplifier according to an embodiment of the disclosure.

FIG. 14 is a schematic flowchart of implementation of yet another protection method for a power amplifier according to an embodiment of the disclosure.

FIG. 15 is a schematic flowchart of implementation of another one protection method for a power amplifier according to an embodiment of the disclosure.

DETAILED DESCRIPTION

The disclosure will be further described in detail below with reference to the drawings and embodiments. It should be understood that embodiments provided here are only intended to explain the disclosure, rather than limiting the disclosure. Furthermore, the embodiments provided below are part of embodiments implementing the disclosure, while all embodiments implementing the disclosure are not provided. Technical solutions recited in the embodiments of the disclosure may be implemented in any combination without conflict.

It should be noted that in the embodiments of the disclosure, terms "including", "include" or any other variants thereof are intended to encompass non-exclusive inclusion, to allow a method or device including a series of elements to include not only elements which are recorded clearly, but also other elements which are not listed clearly or elements inherent to implementation of the method or device. Without further limitation, an element defined by a phrase "including a . . . " does not preclude presence of additional related elements in a method or device including the element (for example, operations in the method or units in the device, for example, the unit may be part of the circuit, part of the processor, part of the program or software, or the like).

A term "and/or" here is only an association relationship describing associated objects and represents that there may be three kinds of relationships. For example, U and/or W may represent that there are three situations: presence of U alone, presence of U and W simultaneously, and presence of W alone. Furthermore, a term "at least one" here represents any one of multiple items or any combination of at least two of multiple items. For example, inclusion of at least one of U, W or V may represent inclusion of any one or more elements selected from a set formed of U, W and V.

The inventors of the present disclosure have recognized that, when voltage protection or current protection is removed, a process of establishing bias of the power amplifier is uncertain. When a signal with large input power is input, the power amplifier may be burnt out due to the large input power at the moment of recovering establishment of a path.

Power amplifier (PA) has a function of amplifying power of a signal, has a high operation power, requires a large voltage and current, and is easy to be burnt out when it is operated improperly. In some implementations, in order to enhance reliability of PA, overvoltage and overcurrent protection circuits may be added in circuit design. In case of overvoltage and overcurrent, a bias current of PA is reduced or even cut off to achieve the purpose of protecting PA.

Figure 1:
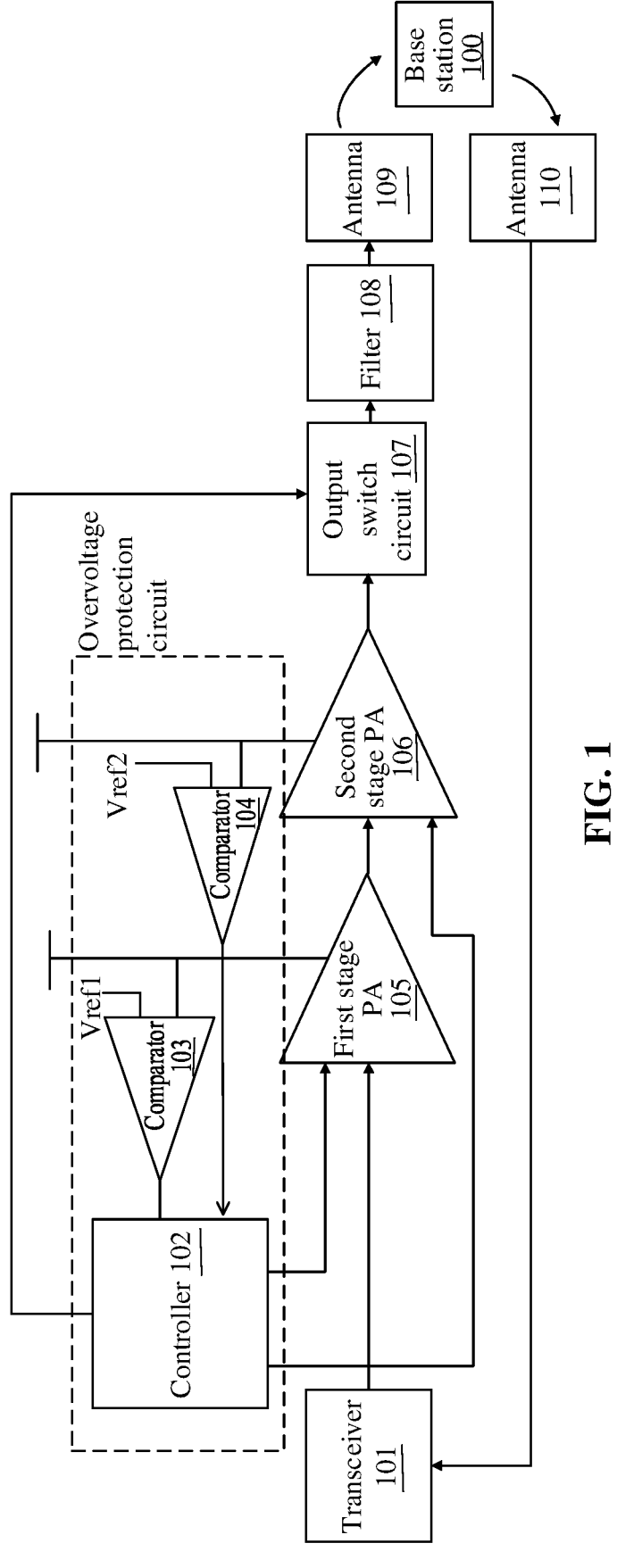
FIG. 1 is a schematic diagram of system compositional structures of an overvoltage protection circuit including a power amplifier in some implementations.

FIG. 1 is a schematic diagram of system compositional structures of an overvoltage protection circuit including a power amplifier in some implementations. As shown in FIG. 1, the system includes a base station 100, a transceiver 101, a controller 102, a comparator 103, a comparator 104, a first stage PA 105, a second stage PA 106, an output switch circuit 107, a filter 108, an antenna 109 and an antenna 110.

Here, a first input end of the comparator 103 is connected to a reference voltage Vref1, a second input end of the comparator 103 is connected to a collector of a power transistor of the first stage PA 105, and an output end of the comparator 103 is connected to a first input end of the controller 102. A first input end of the comparator 104 is connected to a reference voltage Vref2, a second input end of the comparator 104 is connected to a collector of a power transistor of the second stage PA 106, and an output end of the comparator 104 is connected to a second input end of the controller 102. A first output end of the controller 102 is connected to a bias current control input end of the first stage PA 105, a second output end of the controller 102 is connected to a bias current control input end of the second stage PA 106, and a third output end of the controller 102 is connected to a control input end of the output switch circuit 107. The antenna 110 is connected to an input end of the transceiver 101, an output end of the transceiver 101 is connected to a power input end of the first stage PA 105, an output end of the first stage PA 105 is connected to a power input end of the second stage PA 106, an output end of the second stage PA 106 is connected to a power input end of the output switch circuit 107, an output end of the output switch circuit 107 is connected to an input end of the filter 108, and an output end of the filter 108 is connected to the antenna 109. Here, no line is connected between the base station 100 and the antennas 109 and 110, however, the base station 100 may receive a power signal fed back by the antenna 109 and send control commands to the antenna 110.

Figure 2:
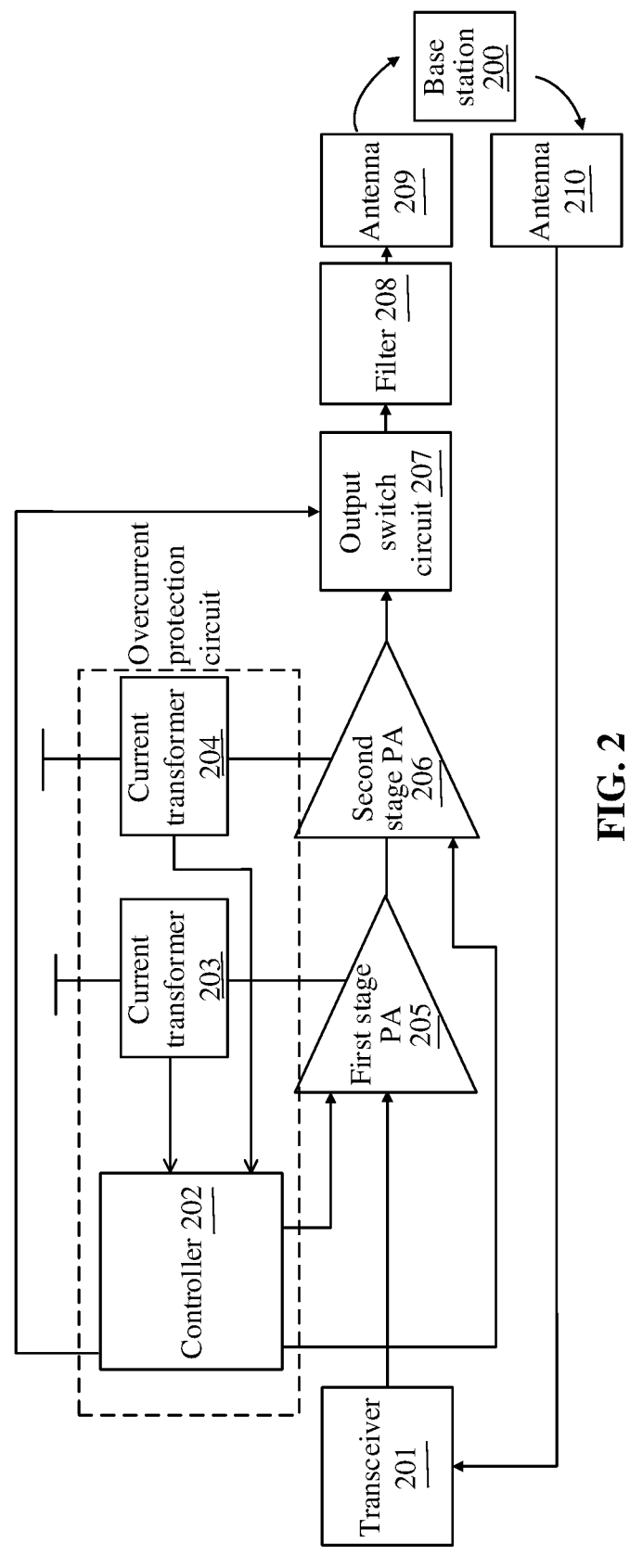
FIG. 2 is a schematic diagram of system compositional structures of an overcurrent protection circuit including a power amplifier in some implementations.

FIG. 2 is a schematic diagram of system compositional structures of an overcurrent protection circuit including a power amplifier in some implementations. As shown in FIG. 2, the system includes a base station 200, a transceiver 201, a controller 202, a current transformer 203, a current transformer 204, a first stage PA 205, a second stage PA 206, an output switch circuit 207, a filter 208, an antenna 209 and an antenna 210.

Here, the current transformer 203 is arranged on a circuit connecting a collector of a power transistor of the first stage PA 205 to a power supply voltage source, and the current transformer 204 is arranged on a circuit connecting a collector of a power transistor of the second stage PA 206 to a power supply voltage source. Output ends of the current transformer 203 and the current transformer 204 are connected to a first input end and a second input end of the controller 202 respectively. A first output end of the controller 202 is connected to a bias current control input end of the first stage PA 205, a second output end of the controller 202 is connected to a bias current control input end of the second stage PA 206, and a third output end of the controller 202 is connected to a control input end of the output switch circuit 207. The antenna 210 is connected to an input end of the transceiver 201, an output end of the transceiver 201 is connected to a power input end of the first stage PA 205, an output end of the first stage PA 205 is connected to a power input end of the second stage PA 206, an output end of the second stage PA 206 is connected to a power input end of the output switch circuit 207, an output end of the output switch circuit 207 is connected to an input end of the filter 208, and an output end of the filter 208 is connected to the antenna 209. Here, no line is connected between the base station 200 and the antennas 209 and 210, however, the base station 200 may receive a power signal fed back by the antenna 209 and send control commands to the antenna 210.

It may be seen from FIG. 1 and FIG. 2 that after voltage protection or current protection is enabled, a bias current of PA may be pulled down or cut off, and in this case, an overall gain of PA becomes low. When the gain of PA becomes low, output power of PA may become low. At this time, in order to ensure that the output power of PA remains at an original target value, under closed-loop control of power of the system, the base station of the system may continuously push up input power of PA to make the output power of PA close to the original target value as much as possible. Since the gain of PA is relatively low at this time, the input power may be pushed to a relatively high power. When the voltage protection or current protection is removed at this time, PA may immediately return to a normal operation state, that is, PA may have a large bias current and a large gain. It may be understood that there may be uncertain states in a process of establishing an entire radio frequency (RF) path to a steady state: a process of establishing bias of PA is uncertain; the output switch circuit connected to the filter (load) on the RF path may not be fully opened, and load of PA is not a certain impedance around 50 ohms. At this time, when a large input signal is input, PA may be broken due to a large input power at the moment of recovering establishment of the RF path.

Figure 3:
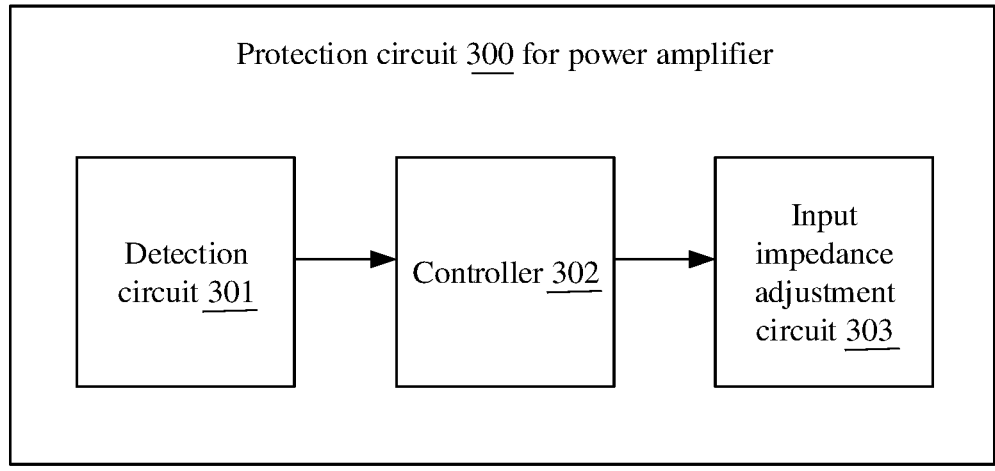
FIG. 3 is a schematic diagram of compositional structures of a protection circuit for a power amplifier according to an embodiment of the disclosure.

In view of this, an embodiment of the disclosure provides a protection circuit for a power amplifier. As shown in FIG. 3, the protection circuit 300 for the power amplifier includes a detection circuit 301, a controller 302 and an input impedance adjustment circuit 303.

The detection circuit 301 is provided with an input end connected to the power amplifier and an output end connected to an input end of the controller 302, and is configured to detect an operation electrical signal of the power amplifier and generate a trigger electrical signal based on the operation electrical signal.

A first output end of the controller 302 is connected to a base or a gate or a bias circuit of the power amplifier, and a second output end of the controller 302 is connected to a control input end of the input impedance adjustment circuit 303.

An output end of the input impedance adjustment circuit 303 is connected to an input end of the power amplifier.

The controller 302 is configured to generate a first control signal and a second control signal based on the trigger electrical signal, the first control signal is configured to control a bias current or bias voltage of the power amplifier to reduce or recover a gain of the power amplifier, and the second control signal is configured to adjust characteristic parameters of the input impedance adjustment circuit 303.

The input impedance adjustment circuit 303 is configured to decrease or increase input power of the power amplifier in response to the second control signal.

Here, the input end of the detection circuit 301 may be connected to a feed end such as a collector or source of the power amplifier, or to other positions where an operation voltage or operation current of the power amplifier may be tested.

In some embodiments, the input impedance adjustment circuit 303 may be a switch circuit, and the characteristic parameters of the input impedance adjustment circuit 303 may include an impedance of the switch circuit, for example, when the switch is turned on or off.

In some other embodiments, the input impedance adjustment circuit 303 may be an adjustable attenuation network, and the characteristic parameters of the input impedance adjustment circuit 303 include at least one of an impedance or insertion loss of the adjustable attenuation network.

In some possible embodiments, the input end of the input impedance adjustment circuit 303 is connected to a transceiver configured to provide input power to the power amplifier, it may be that the input end of the input impedance adjustment circuit 303 is connected to an output end of an input impedance matching circuit, and an input end of the input impedance matching circuit is connected to the transceiver configured to provide input power to the power amplifier. That is, while there is an impedance matching circuit between the transceiver and the power amplifier, the input impedance adjustment circuit 303 is also arranged.

The power amplifier in the embodiment of the disclosure may include multi-stage amplifiers, and multiple amplifiers may have the same or different magnifications. For example, the power amplifier may include a first stage amplifier and a second stage amplifier, and magnification of the first stage amplifier is the same as that of the second stage amplifier. Here, each stage amplifier may be connected to the detection circuit, or only part of the amplifiers may be connected to the detection circuit. For example, a final stage amplifier of the multi-stage amplifiers is connected to the detection circuit, and other stage amplifiers are not connected to the detection circuit. For another example, last two stage amplifiers of the multi-stage amplifiers are connected to the detection circuit.

Here, the operation electrical signal of the power amplifier may include at least an operation voltage signal or operation current signal of the power amplifier.

It may be understood that the detection circuit 301 may include at least one of a voltage detection circuit or a current detection circuit. In case that the detection circuit 301 includes the voltage detection circuit and the current detection circuit simultaneously, and the input end of the detection circuit 301 is connected to the feed end of the power amplifier, the detection circuit 301 may obtain a voltage signal and current signal of the power amplifier simultaneously, and take the voltage signal and current signal as an operation current and an operation voltage (the operation electrical signal) of the power amplifier respectively. When the power amplifier includes multi-stage amplifiers, the multi-stage amplifiers may be connected to different detection circuits, for example, the final stage amplifier is connected to the voltage detection circuit, and an intermediate stage amplifier is connected to the current detection circuit.

In a possible implementation, the trigger electrical signal may include a trigger voltage signal and a trigger current signal. The trigger electrical signal represents a voltage signal and/or current signal configured to trigger the protection circuit for the power amplifier. Of course, the trigger voltage signal may be a voltage signal or logic signal obtained after performing a comparison operation on voltage at the feed end of the amplifier. Current of the amplifier may be directly taken as the trigger current signal.

In a possible implementation, the controller 302 may be at least one of an Application Specific Integrated Circuit (ASIC), a Digital Signal Processor (DSP), a Digital Signal Processing Device (DSPD), a Programmable Logic Device (PLD), a Central Processing Unit (CPU), a controller, a microcontroller, or a microprocessor. The controller 302 may generate the first control signal configured to control the bias current or bias voltage of the power amplifier and the second control signal configured to control the input impedance adjustment circuit 303 to be turned on or off, based on the trigger electrical signal.

It may be understood that in case that the electrical trigger signal is obtained by the controller 302 from the detection circuit 301 and indicates occurrence of overvoltage and/or overcurrent, the controller 302 generates a control signal configured to decrease a bias current or bias voltage of a power transistor of the power amplifier, to reduce the gain of the power amplifier, and generates a control signal configured to increase the characteristic parameters of the input impedance adjustment circuit 303, to decrease an input power signal provided by the transceiver to the power amplifier, thus implementing protection of the power amplifier.

In some embodiments, in case that the electrical trigger signal indicates occurrence of overvoltage and/or overcurrent, the controller 302 is also configured to generate a control signal configured to cut off the bias current or bias voltage, or turn off an output switch circuit of the power amplifier, to turn off the bias circuit or load filter of the power amplifier. In some other embodiments, in case that the electrical trigger signal indicates that overvoltage and overcurrent states are removed, the controller 302 is also configured to generate a control signal configured to turn on the bias circuit or output switch circuit of the power amplifier, so that the power amplifier may operate normally.

In the embodiments of the disclosure, since the protection circuit for the power amplifier includes the input impedance adjustment circuit connected to the transceiver and a power input end of the power amplifier, when voltage protection or current protection are removed, the characteristic parameters of the input impedance adjustment circuit may be adjusted in a process of establishing bias of the power amplifier, to decrease an input power signal and reduce a problem where the power amplifier is burnt out due to a large input power at the moment of recovering establishment of the path.

In some embodiments, when the first control signal recovers the gain of the power amplifier, the second control signal increases the input power of the power amplifier after a preset time elapses. Here, the preset time may be a time required for the power amplifier to be stable.

Figure 4:
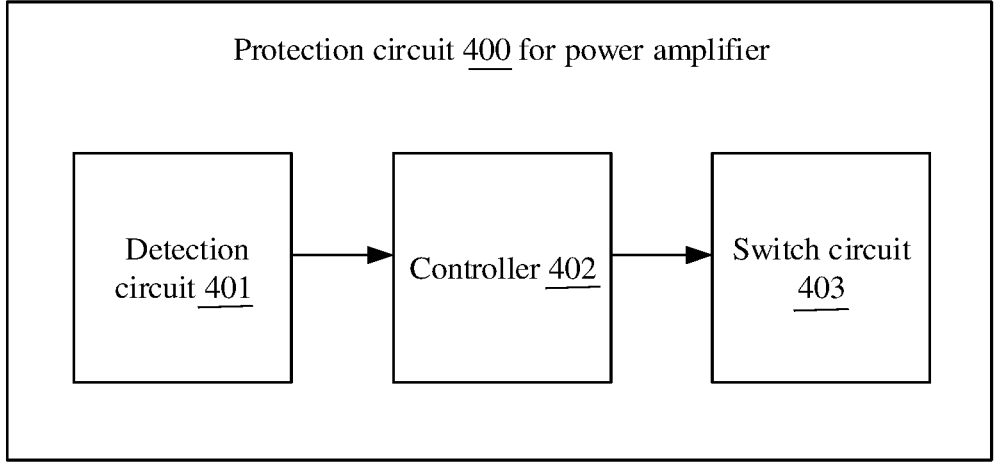
FIG. 4 is a schematic diagram of compositional structures of another protection circuit for a power amplifier according to an embodiment of the disclosure.

FIG. 4 is a schematic diagram of compositional structures of another protection circuit for a power amplifier according to an embodiment of the disclosure. As shown in FIG. 4, the protection circuit 400 for the power amplifier includes a detection circuit 401, a controller 402 and a switch circuit 403. The detection circuit 401 is provided with an input end connected to the power amplifier and an output end connected to an input end of the controller 402, and is configured to detect an operation electrical signal of the power amplifier and generate a trigger electrical signal based on the operation electrical signal.

A first output end of the controller 402 is connected to a base or a gate or a bias circuit of the power amplifier, and a second output end of the controller 402 is connected to a control input end of the switch circuit 403.

The switch circuit 403 is connected to an input end of the power amplifier.

The controller 402 is configured to generate a first control signal and a second control signal based on the trigger electrical signal, the first control signal is configured to control a bias current or bias voltage of the power amplifier to reduce or recover a gain of the power amplifier, and the second control signal is configured to adjust characteristic parameters of the switch circuit 403.

The switch circuit 403 is configured to adjust an impedance itself in response to the second control signal, to turn on or off the input power of the power amplifier, or decrease or increase the input power of the power amplifier.

It may be understood that the switch circuit 403 may adjust the impedance itself to 0 or to be close to 0, and the switch circuit 403 is in a turn-on state at this time. The switch circuit 403 may adjust the impedance itself to infinity or to be greater than a set impedance value, and the switch circuit 403 is in a turn-off state at this time.

In some embodiments, the input end of the switch circuit 403 is connected to a transceiver configured to provide input power to the power amplifier.

In the embodiments of the disclosure, since the protection circuit for the power amplifier includes the switch circuit connected to the transceiver and a power input end of the power amplifier, when voltage protection or current protection is removed, the impedance of the switch circuit may be adjusted in a process of establishing bias of the power amplifier, to decrease an input power signal and reduce a problem where the power amplifier is burnt out due to a large input power at the moment of recovering establishment of the path.

Figure 5:
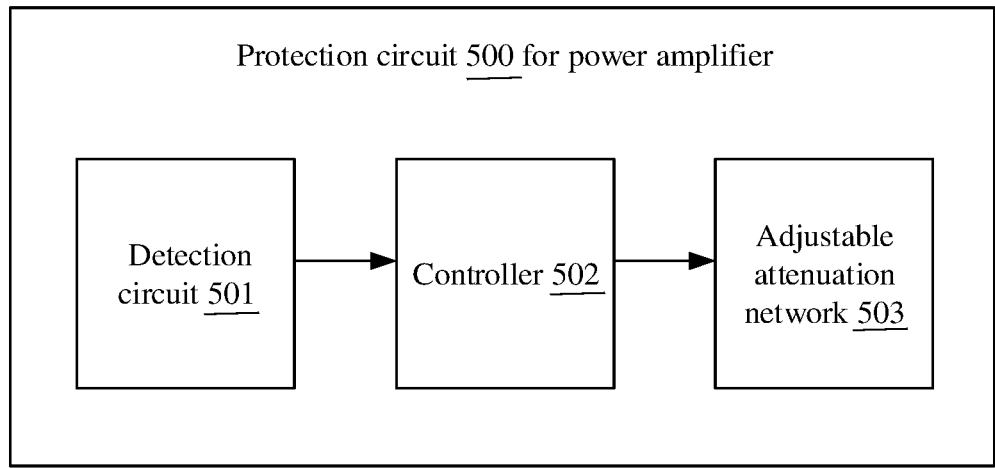
FIG. 5 is a schematic diagram of compositional structures of still another protection circuit for a power amplifier according to an embodiment of the disclosure.

FIG. 5 is a schematic diagram of compositional structures of still another protection circuit for a power amplifier according to an embodiment of the disclosure. As shown in FIG. 5, the protection circuit 500 for the power amplifier includes a detection circuit 501, a controller 502 and an adjustable attenuation network 503. The detection circuit 501 is provided with an input end connected to the power amplifier and an output end connected to an input end of the controller 502, and is configured to detect an operation electrical signal of the power amplifier and generate a trigger electrical signal based on the operation electrical signal.

A first output end of the controller 502 is connected to a base or a gate or a bias circuit of the power amplifier, and a second output end of the controller 502 is connected to a control input end of the adjustable attenuation network 503.

An output end of the adjustable attenuation network 503 is connected to an input end of the power amplifier.

The controller 402 is configured to generate a first control signal and a second control signal based on the trigger electrical signal, the first control signal is configured to control a bias current or bias voltage of the power amplifier to reduce or recover a gain of the power amplifier, and the second control signal is configured to adjust at least an impedance or insertion loss of the adjustable attenuation network 503.

The adjustable attenuation network 503 is configured to adjust at least the impedance or the insertion loss itself in response to the second control signal, to decrease or increase input power of the power amplifier.

In some embodiments, the input end of the adjustable attenuation network 503 is connected to a transceiver configured to provide input power to the power amplifier.

In the embodiments of the disclosure, since the protection circuit for the power amplifier includes the adjustable attenuation network connected to the transceiver and a power input end of the power amplifier, when voltage protection or current protection is removed, at least the impedance or the insertion loss of the adjustable attenuation network may be adjusted in a process of establishing bias of the power amplifier, to decrease an input power signal and reduce a problem where the power amplifier is burnt out due to a large input power at the moment of recovering establishment of the path.

Figure 6:
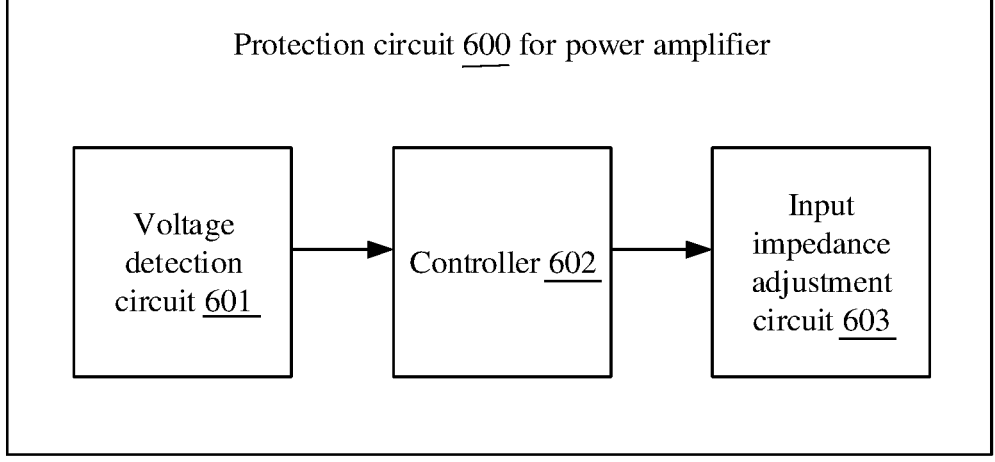
FIG. 6 is a schematic diagram of compositional structures of yet another protection circuit for a power amplifier according to an embodiment of the disclosure.

FIG. 6 is a schematic diagram of compositional structures of yet another protection circuit for a power amplifier according to an embodiment of the disclosure. As shown in FIG. 6, the protection circuit 600 for the power amplifier includes a voltage detection circuit 601, a controller 602 and an input impedance adjustment circuit 603.

The voltage detection circuit 601 is provided with a first input end configured to obtain a reference voltage, a second input end connected to a feed end of the power amplifier and an output end connected to a first input end of the controller 602, and is configured to detect an operation voltage signal of the power amplifier and generate a trigger voltage signal based on the operation voltage signal.

A first output end of the controller 602 is connected to a base or a gate or a bias circuit of the power amplifier, and a second output end of the controller 602 is connected to a control input end of the input impedance adjustment circuit 603.

An output end of the input impedance adjustment circuit 603 is connected to an input end of the power amplifier.

The controller 602 is configured to generate a first control signal and a second control signal based on the trigger voltage signal, the first control signal is configured to control a bias current or bias voltage of the power amplifier to reduce or recover a gain of the power amplifier, and the second control signal is configured to adjust characteristic parameters of the input impedance adjustment circuit 603.

The input impedance adjustment circuit 603 is configured to decrease or increase input power of the power amplifier in response to the second control signal.

It may be understood that a voltage amplitude of the reference voltage may be equal to an amplitude of a direct current (DC) power supply connected to a collector of a power transistor of the power amplifier, that is, the voltage amplitude of the reference voltage may also be a voltage signal Vcc.

In some embodiments, the input end of the input impedance adjustment circuit 603 is connected to a transceiver configured to provide input power to the power amplifier.

In some possible implementations, the voltage detection circuit 601 may compare a detected actual voltage on the collector of the power transistor of the power amplifier with a voltage of the reference voltage, obtain a comparison result, and provide the comparison result to the controller 602, so that the controller 602 generates the first control signal and the second control signal. Here, the comparison result may be a logic signal (0 or 1) configured to indicate whether the power amplifier is in an overvoltage state.

In some implementations, in case that the controller 602 determines that the trigger voltage signal indicates occurrence of overvoltage protection, the controller 602 generates a first control signal configured to control the bias current or bias voltage of the power amplifier to be reduced and a second control signal configured to increase the characteristic parameters of the input impedance adjustment circuit 603, and in case that the controller 602 determines that the trigger voltage signal indicates non-occurrence of overvoltage protection, the controller 602 generates a first control signal configured to control the bias current or bias voltage of the power amplifier to be recovered and a second control signal configured to decrease the characteristic parameters of the input impedance adjustment circuit 603.

In the embodiments of the disclosure, since the protection circuit for the power amplifier includes the input impedance adjustment circuit connected to the input end of the power amplifier, when voltage protection is removed, the characteristic parameters of the input impedance adjustment circuit may be increased in a process of establishing bias of the power amplifier, to decrease an input power signal and reduce a problem where the power amplifier is burnt out due to a large input power at the moment of recovering establishment of the path.

Figure 7:
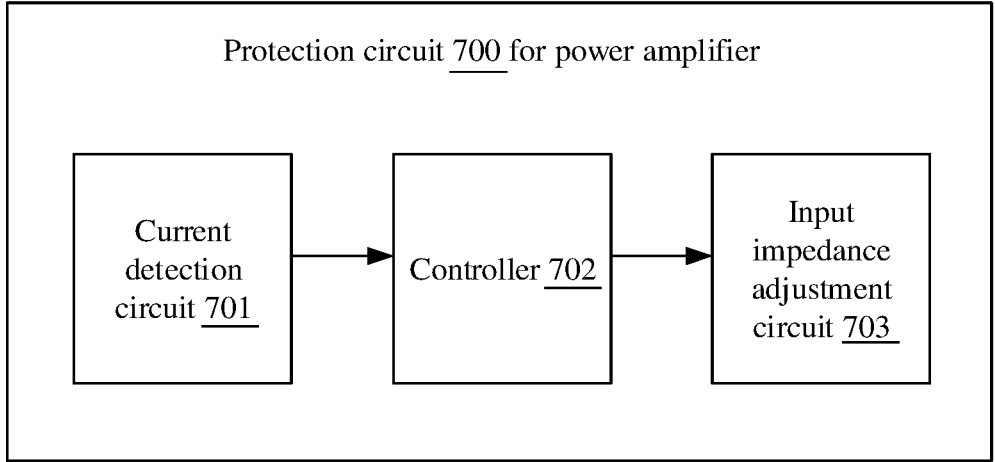
FIG. 7 is a schematic diagram of compositional structures of still another protection circuit for a power amplifier according to an embodiment of the disclosure.

FIG. 7 is a schematic diagram of compositional structures of still another protection circuit for a power amplifier according to an embodiment of the disclosure. As shown in FIG. 7, the protection circuit 700 for the power amplifier includes a current detection circuit 701, a controller 702 and an input impedance adjustment circuit 703.

The current detection circuit 701 is provided with an input end connected to a feed end of the power amplifier and an output end connected to a second input end of the controller 702.

The current detection circuit 701 is configured to detect an operation current signal of the power amplifier and generate a trigger current signal based on the operation current signal.

A first output end of the controller 702 is connected to a base or a gate or a bias circuit of the power amplifier, and a second output end of the controller 702 is connected to a control input end of the input impedance adjustment circuit 703.

An output end of the input impedance adjustment circuit 703 is connected to an input end of the power amplifier.

The controller 702 is configured to generate a first control signal and a second control signal based on the trigger current signal, the first control signal is configured to control a bias current or bias voltage of the power amplifier to reduce or recover a gain of the power amplifier, and the second control signal is configured to adjust characteristic parameters of the input impedance adjustment circuit 703.

The input impedance adjustment circuit 703 is configured to decrease or increase input power of the power amplifier in response to the second control signal.

In some possible implementations, the current detection circuit 701 may input a detected current flowing on the feed end of the power amplifier to the controller 702 as the trigger current signal, to determine by the controller 702 whether overcurrent occurs on the power amplifier.

In some embodiments, the input end of the input impedance adjustment circuit 703 is connected to a transceiver configured to provide input power to the power amplifier.

In some implementations, in case that the controller 702 determines that the trigger current signal indicates occurrence of overcurrent protection, the controller 702 generates a first control signal configured to control the bias current of the power amplifier to be reduced and a second control signal configured to increase the characteristic parameters of the input impedance adjustment circuit 703, and in case that the controller 702 determines that the trigger current signal indicates non-occurrence of overcurrent protection, the controller 702 generates a first control signal configured to control the bias current or bias voltage of the power amplifier to be recovered and a second control signal configured to decrease the characteristic parameters of the input impedance adjustment circuit 703.

In the embodiments of the disclosure, since the protection circuit for the power amplifier includes the input impedance adjustment circuit connected to the transceiver and a power input end of the power amplifier, when current protection is removed, the characteristic parameters of the input impedance adjustment circuit may be increased in a process of establishing bias of the power amplifier, to decrease an input power signal and reduce a problem where the power amplifier is burnt out due to a large input power at the moment of recovering establishment of the path.

Figure 8:
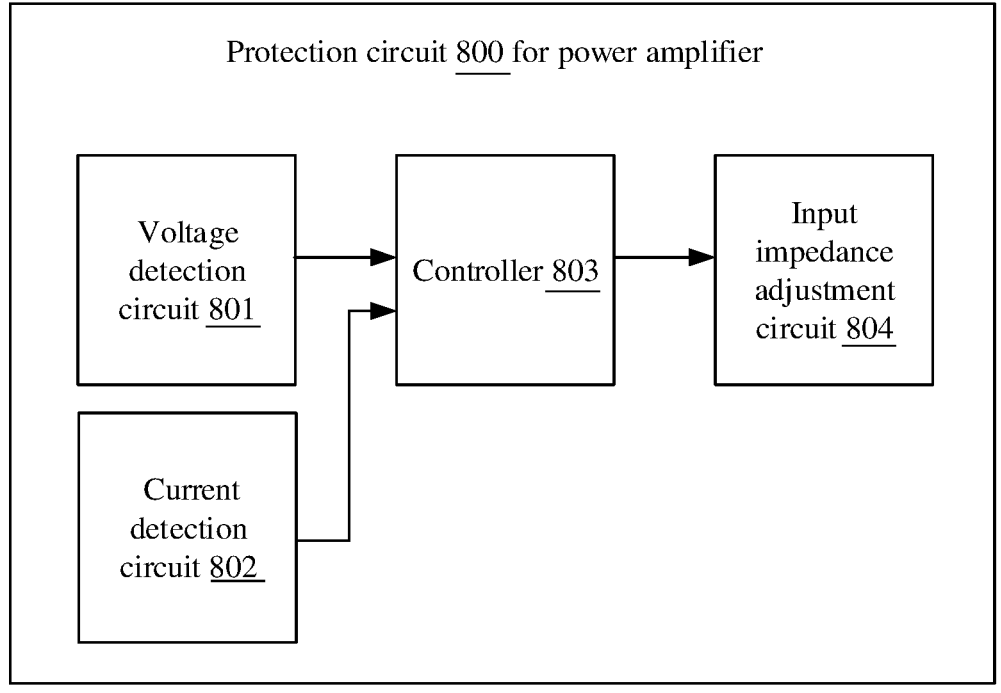
FIG. 8 is a schematic diagram of compositional structures of another one protection circuit for a power amplifier according to an embodiment of the disclosure.

FIG. 8 is a schematic diagram of compositional structures of another one protection circuit for a power amplifier according to an embodiment of the disclosure. As shown in FIG. 8, the protection circuit 800 for the power amplifier includes a voltage detection circuit 801, a current detection circuit 802, a controller 803 and an input impedance adjustment circuit 804.

The voltage detection circuit 801 is provided with a first input end configured to obtain a reference voltage, a second input end connected to a feed end of the power amplifier and an output end connected to a first input end of the controller 803.

The voltage detection circuit 801 is configured to detect an operation voltage signal of the power amplifier and generate a trigger voltage signal based on the operation voltage signal.

The current detection circuit 802 is provided with an input end connected to the feed end of the power amplifier and an output end connected to a second input end of the controller 803.

The current detection circuit 802 is configured to detect an operation current signal of the power amplifier and generate a trigger current signal based on the operation current signal.

A first output end of the controller 803 is connected to a base or a gate or a bias circuit of the power amplifier, and a second output end of the controller 803 is connected to a control input end of the input impedance adjustment circuit 804.

An output end of the input impedance adjustment circuit 804 is connected to an input end of the power amplifier.

The controller 803 is configured to generate a first control signal and a second control signal based on the trigger current signal and the trigger voltage signal, the first control signal is configured to control a bias current or bias voltage of the power amplifier to reduce or recover a gain of the power amplifier, and the second control signal is configured to adjust characteristic parameters of the input impedance adjustment circuit 804.

The input impedance adjustment circuit 804 is configured to decrease or increase input power of the power amplifier in response to the second control signal.

In some possible implementations, the controller 803 generating the first control signal and the second control signal based on the trigger current signal and the trigger voltage signal may be that the controller 803 determines whether overcurrent occurs on the power amplifier based on the trigger current signal, determines whether overvoltage occurs on the power amplifier based on the trigger voltage signal, and generates the first control signal and the second control signal when it determines that any one of overcurrent or overvoltage occurs on the power amplifier.

In some embodiments, the input end of the input impedance adjustment circuit 804 is connected to a transceiver configured to provide input power to the power amplifier.

In the embodiments of the disclosure, since the protection circuit for the power amplifier includes the input impedance adjustment circuit connected to the transceiver and a power input end of the power amplifier, when current protection and voltage protection are removed, the characteristic parameters of the input impedance adjustment circuit may be adjusted in a process of establishing bias of the power amplifier, to decrease an input power signal and reduce a problem where the power amplifier is burnt out due to a large input power at the moment of recovering establishment of the path.

Figure 9:
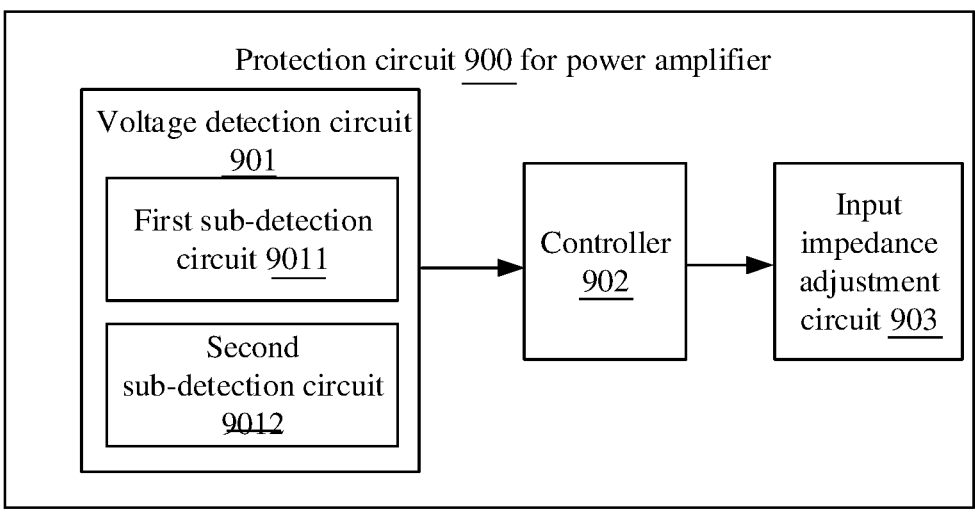
FIG. 9 is a schematic diagram of compositional structures of still another one protection circuit for a power amplifier according to an embodiment of the disclosure.

FIG. 9 is a schematic diagram of compositional structures of still another one protection circuit for a power amplifier according to an embodiment of the disclosure. As shown in FIG. 9, the protection circuit 900 for the power amplifier includes a voltage detection circuit 901, a controller 902 and an input impedance adjustment circuit 903. The power amplifier includes a first stage amplifier and a second stage amplifier. The reference voltage includes a first reference voltage and a second reference voltage. The voltage detection circuit 901 includes a first sub-detection circuit 9011 and a second sub-detection circuit 9012. The trigger voltage signal includes a first sub-trigger signal and a second sub-trigger signal. The first input end of the controller 902 includes a first sub-port and a second sub-port, and the first output end of the controller 902 includes a third sub-port and a fourth sub-port.

The first sub-detection circuit 9011 is provided with a first input end connected to the first reference voltage, a second input end connected to the first stage amplifier and an output end connected to the first sub-port. The second sub-detection circuit 9012 is provided with a first input end connected to the second reference voltage, a second input end connected to the second stage amplifier and an output end connected to the second sub-port. The third sub-port is connected to a base or a gate or a bias circuit of the first stage amplifier, and the fourth sub-port is connected to a base or a gate or a bias circuit of the second stage amplifier.

The first sub-detection circuit 9011 is configured to detect an operation voltage signal of the first stage amplifier and generate the first sub-trigger signal based on the operation voltage signal of the first stage amplifier and the first reference voltage. The second sub-detection circuit 9012 is configured to detect an operation voltage signal of the second stage amplifier and generate the second sub-trigger signal based on the operation voltage signal of the second stage amplifier and the second reference voltage.

A first output end of the controller 902 is connected to a base or a gate or a bias circuit of the power amplifier, and a second output end of the controller 902 is connected to a control input end of the input impedance adjustment circuit 903.

An output end of the input impedance adjustment circuit 903 is connected to an input end of the power amplifier.

The controller 902 is configured to generate a first sub-control signal based on the first sub-trigger signal to reduce or recover a gain of the first stage amplifier, generate a second sub-control signal based on the second sub-trigger signal to reduce or recover a gain of the second stage amplifier, and generate the second control signal based on the first sub-trigger signal and the second sub-trigger signal. The second control signal is configured to adjust characteristic parameters of the input impedance adjustment circuit 903.

The input impedance adjustment circuit 903 is configured to decrease or increase input power of the power amplifier in response to the second control signal.

It may be understood that a voltage amplitude of the reference voltage may be equal to an amplitude of a DC power supply connected to a collector of a power transistor of the power amplifier, that is, the voltage amplitude of the reference voltage may also be Vcc.

In some possible implementations, the first sub-detection circuit 9011 may compare a detected actual voltage on a collector of a power transistor of the first stage amplifier with a voltage of the first reference voltage, obtain a comparison result, and provide the comparison result to the controller 902, so that the controller 902 generates the first control signal and the second control signal. Here, the comparison result may be a logic signal (0 or 1) configured to indicate whether the first stage amplifier is in an overvoltage state.

In some possible implementations, the second sub-detection circuit 9011 may compare a detected actual voltage on a collector of a power transistor of the second stage amplifier with a voltage of the second reference voltage, obtain a comparison result, and provide the comparison result to the controller 902, so that the controller 902 generates the first control signal and the second control signal. Here, the comparison result may be a logic signal (0 or 1) configured to indicate whether the second stage amplifier is in an overvoltage state.

In some other possible implementations, the first trigger voltage signal may further include an operation voltage of the power transistor of the first stage amplifier when the first stage amplifier is in the overvoltage state, and the second trigger voltage signal may further include an operation voltage of the power transistor of the second stage amplifier when the second stage amplifier is in the overvoltage state.

In some implementations, the controller 902 configured to generate the first sub-control signal based on the first sub-trigger signal to reduce or recover the gain of the first stage amplifier, and generate the second sub-control signal based on the second sub-trigger signal to reduce or recover the gain of the second stage amplifier, may be that the controller 902 determines whether overvoltage occurs on each stage amplifier of the first stage amplifier and the second stage amplifier according to the first sub-trigger signal and the second sub-trigger signal respectively, and generates a bias current configured to decrease or turn off a corresponding stage amplifier where overvoltage occurs, when it determines that overvoltage occurs on the corresponding stage amplifier. The controller 902 may generate a second control signal configured to increase the characteristic parameters of the input impedance adjustment circuit 903, according to operation voltages of the first stage amplifier and the second stage amplifier when overvoltage occurs on the power amplifier.

It may be understood that in case that the input impedance adjustment circuit 903 is an adjustable attenuation network, a mapping relationship between operation voltages of the first stage amplifier and the second stage amplifier and characteristic parameters of the adjustable attenuation network may be established in advance. Target characteristic parameters of the adjustable attenuation network are determined according to the mapping relationship, and real-time operation voltages of the first stage amplifier and the second stage amplifier when overvoltage occurs, and the second control signal corresponding to the target parameters of the adjustable attenuation network is generated.

In some possible implementations, the controller 902 configured to generate the second control signal based on the first sub-trigger signal and the second sub-trigger signal, may be that the controller 902 determines whether overvoltage occurs on the first stage amplifier based on the first sub-trigger signal, determines whether overvoltage occurs on the second stage amplifier based on the second sub-trigger signal, and generates the second control signal configured to adjust the characteristic parameters of the input impedance adjustment circuit 903, when it determines that overvoltage occurs on any one of the first stage amplifier or the second stage amplifier.

In the embodiments of the disclosure, since the protection circuit for the power amplifier includes the input impedance adjustment circuit connected to the transceiver and a power input end of the power amplifier, when the first sub-trigger signal and the second sub-trigger signal generated according to the operation current of the first stage amplifier and the operation voltage of the second stage amplifier detected by the first sub-detection circuit and the second sub-detection circuit respectively indicate that voltage protection is removed, the input impedance adjustment circuit may be adjusted in a process of establishing bias of the power amplifier, to decrease an input power signal and reduce a problem where the power amplifier is burnt out due to a large input power at the moment of recovering establishment of the path.

Figure 10:
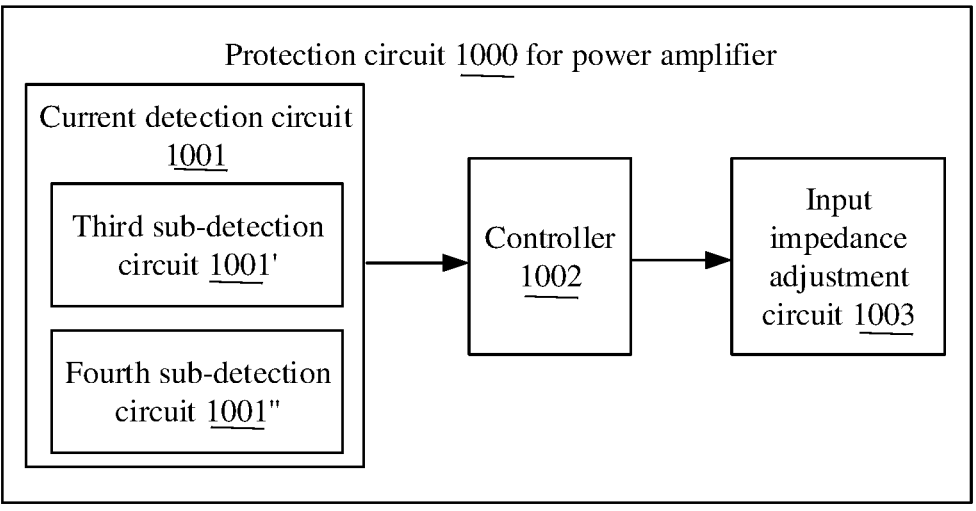
FIG. 10 is a schematic diagram of compositional structures of yet another protection circuit for a power amplifier according to an embodiment of the disclosure.

FIG. 10 is a schematic diagram of compositional structures of yet another protection circuit for a power amplifier according to an embodiment of the disclosure. As shown in FIG. 10, the protection circuit 1000 for the power amplifier includes a current detection circuit 1001, a controller 1002 and an input impedance adjustment circuit 1003. The current detection circuit 1001 includes a third sub-detection circuit 1001' and a fourth sub-detection circuit 1001". The trigger current signal includes a third sub-trigger signal and a fourth sub-trigger signal. A second input end of the controller 1002 includes a fifth sub-port and a sixth sub-port.

The third sub-detection circuit 1001' is provided with an input end connected to the first stage amplifier and an output end connected to the fifth sub-port of the controller. The fourth sub-detection circuit 1001" is provided with an input end connected to the second stage amplifier and an output end connected to the sixth sub-port of the controller. The third sub-port is connected to the base or the gate or the bias circuit of the first stage amplifier. The fourth sub-port is connected to the base or the gate or the bias circuit of the second stage amplifier. The second output end of the controller 1002 is connected to the control input end of the input impedance adjustment circuit 1003.

The third sub-detection circuit 1001' is configured to detect an operation current signal of the first stage amplifier and generate the third sub-trigger signal based on the operation current signal of the first stage amplifier.

The fourth sub-detection circuit 1001" is configured to detect an operation current signal of the second stage amplifier and generate the fourth sub-trigger signal based on the operation current signal of the second stage amplifier.

A first output end of the controller 1002 is connected to a base or a gate or a bias circuit of the power amplifier.

An output end of the input impedance adjustment circuit 1003 is connected to an input end of the power amplifier.

The controller 1002 is configured to generate the first sub-control signal based on the third sub-trigger signal to reduce or recover the gain of the first stage amplifier, generate the second sub-control signal based on the fourth sub-trigger signal to reduce or recover the gain of the second stage amplifier, and generate the second control signal based on the third sub-trigger signal and the fourth sub-trigger signal. The second control signal is configured to adjust characteristic parameters of the input impedance adjustment circuit 1003.

The input impedance adjustment circuit 1003 is configured to decrease or increase input power of the power amplifier in response to the second control signal.

In some possible implementations, the third sub-trigger signal may include an operation current of the power transistor of the first stage amplifier when the first stage amplifier is in an overcurrent state, and the fourth sub-trigger signal may include an operation current of the power transistor of the second stage amplifier when the second stage amplifier is in an overcurrent state.

It may be understood that in case that the input impedance adjustment circuit 1003 is an adjustable attenuation network, a mapping relationship between operation currents of the first stage amplifier and the second stage amplifier and characteristic parameters of the adjustable attenuation network may be established in advance. Target characteristic parameters of the adjustable attenuation network are determined according to the mapping relationship, and real-time operation currents of the first stage amplifier and the second stage amplifier when overcurrent occurs, and the second control signal corresponding to the target characteristic parameters of the adjustable attenuation network is generated.

In some possible implementations, the controller 1002 configured to generate the second control signal based on the third sub-trigger signal and the fourth sub-trigger signal, may be that the controller 1002 determines whether overcurrent occurs on the first stage amplifier based on the third sub-trigger signal, determines whether overcurrent occurs on the second stage amplifier based on the fourth sub-trigger signal, and generates the second control signal configured to increase the characteristic parameters of the input impedance adjustment circuit 1003, when it determines that overcurrent occurs on any one of the first stage amplifier or the second stage amplifier.

In the embodiments of the disclosure, since the protection circuit for the power amplifier includes the input impedance adjustment circuit connected to the transceiver and a power input end of the power amplifier, when the third sub-trigger signal and the fourth sub-trigger signal generated according to operation currents of the first stage amplifier and the second stage amplifier detected by the third sub-detection circuit and the fourth sub-detection circuit respectively indicate that current protection is removed, the characteristic parameters of the input impedance adjustment circuit may be adjusted in a process of establishing bias of the power amplifier, to decrease an input power signal and reduce a problem where the power amplifier is burnt out due to a large input power at the moment of recovering establishment of the path.

Figure 11:
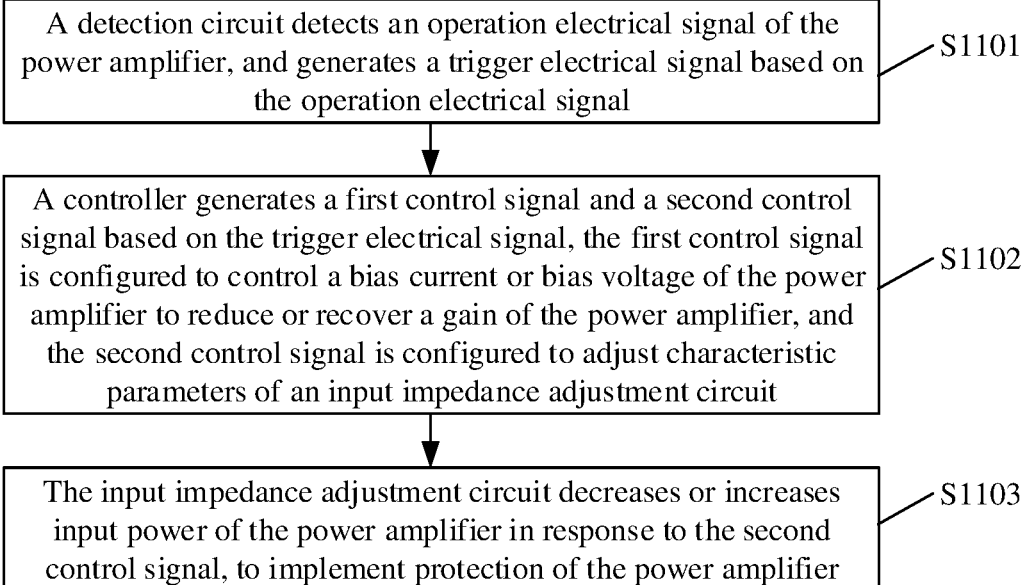
FIG. 11 is a schematic flowchart of implementation of a protection method for a power amplifier according to an embodiment of the disclosure.

Based on the above embodiments, an embodiment of the disclosure provides a protection method for a power amplifier, applied to the above protection circuit for the power amplifier. As shown in FIG. 11, the method includes the following operations S1101 to S1103.

In operation S1101, a detection circuit detects an operation electrical signal of the power amplifier, and generates a trigger electrical signal based on the operation electrical signal.

In operation S1102, a controller generates a first control signal and a second control signal based on the trigger electrical signal, the first control signal is configured to control a bias current or bias voltage of the power amplifier to reduce or recover a gain of the power amplifier, and the second control signal is configured to adjust characteristic parameters of an input impedance adjustment circuit.

In operation S1103, the input impedance adjustment circuit decreases or increases input power of the power amplifier in response to the second control signal, to implement protection of the power amplifier.

FIG. 12 is a schematic flowchart of implementation of another protection method for a power amplifier according to an embodiment of the disclosure. As shown in FIG. 12, the flow includes the following operations S1201 to S1205.

In operation S1201, a detection circuit detects an operation voltage signal of the power amplifier.

In operation S1202, a result of comparing an amplitude of the operation voltage signal with an amplitude of a reference voltage is determined as a trigger voltage signal.

It may be understood that the result of comparing the amplitude of the operation voltage signal of the power amplifier with the amplitude of the reference voltage may be an actual amplitude difference. This amplitude difference may be a positive or negative number. The trigger voltage signal may be represented by logic 0 or 1. For example, in case that a difference between the amplitude of the operation voltage signal of the power amplifier and the amplitude of the reference voltage is less than a preset amplitude range, the trigger voltage signal is determined to be logic 0, that is, indicating that the power amplifier is not in an overvoltage state. In case that the difference between the amplitude of the operation voltage signal of the power amplifier and the amplitude of the reference voltage is greater than or equal to the preset amplitude range, the trigger voltage signal is determined to be logic 4, that is, indicating that the power amplifier is in the overvoltage state.

In operation S1203, a controller determines whether the power amplifier is in an overvoltage state according to the trigger voltage signal.

In operation S1204, a first signal and a second signal are generated in response to determining that the power amplifier is in the overvoltage state, the first signal is configured to reduce or cut off a bias current or bias voltage of the power amplifier, and the second signal is configured to increase characteristic parameters of an input impedance adjustment circuit.

In operation S1205, the input impedance adjustment circuit decreases input power of the power amplifier in response to the second signal, to implement protection of the power amplifier.

FIG. 13 is a schematic flowchart of implementation of still another protection method for a power amplifier according to an embodiment of the disclosure. As shown in FIG. 13, the flow includes the following operations S1301 to S1305.

In operation S1301, a detection circuit detects an operation voltage signal of the power amplifier.

In operation S1302, a result of comparing an amplitude of the operation voltage signal with an amplitude of a reference voltage is determined as a trigger voltage signal.

In operation S1303, a controller determines whether the power amplifier is in a normal voltage state, according to the trigger voltage signal.

In operation S1304, a third signal is generated in response to determining that the power amplifier is in the normal voltage state, and a preset time is delayed to generate a fourth signal, the third signal is configured to recover a bias current or bias voltage of the power amplifier, the fourth signal is configured to decrease characteristic parameters of an input impedance adjustment circuit.

It may be understood that the preset time is greater than a time required for the system to reach a stable state. For example, the preset time may be 10 microseconds.

In operation S1305, the input impedance adjustment circuit increases input power of the power amplifier in response to the fourth signal, to implement protection of the power amplifier.

FIG. 14 is a schematic flowchart of implementation of yet another protection method for a power amplifier according to an embodiment of the disclosure. As shown in FIG. 14, the flow includes the following operations S1401 to S1405.

In operation S1401, a detection circuit detects an operation current signal of the power amplifier.

In operation S1402, the operation current signal is determined as a trigger current signal.

In operation S1403, a controller determines whether the power amplifier is in an overcurrent state, according to the trigger current signal.

In operation S1404, a first signal and a second signal are generated in response to determining that the power amplifier is in the overcurrent state, the first signal is configured to reduce or cut off a bias current or bias voltage of the power amplifier, and the second signal is configured to increase characteristic parameters of an input impedance adjustment circuit.

In operation S1405, the input impedance adjustment circuit decreases input power of the power amplifier in response to the second control signal, to implement protection of the power amplifier.

FIG. 15 is a schematic flowchart of implementation of another one protection method for a power amplifier according to an embodiment of the disclosure. As shown in FIG. 15, the flow includes the following operations S1501 to S1505.

In operation S1501, a detection circuit detects an operation current signal of the power amplifier.

In operation S1502, the operation current signal is determined as a trigger current signal.

In operation S1503, a controller determines whether the power amplifier is in a normal current state, according to the trigger current signal.

In operation S1504, a third signal and a fourth signal are generated in response to determining that the power amplifier is in the normal current state, the third signal is configured to recover a bias current or bias voltage of the power amplifier, the fourth signal is configured to decrease characteristic parameters of an input impedance adjustment circuit.

In operation S1505, the input impedance adjustment circuit increases input power of the power amplifier in response to the fourth signal, to implement protection of the power amplifier.

In some embodiments, the input impedance adjustment circuit may include a switch circuit, and the characteristic parameters of the input impedance adjustment circuit include an impedance of the switch circuit.

In some other embodiments, the input impedance adjustment circuit may include an adjustable attenuation network, and the characteristic parameters of the input impedance adjustment circuit include at least an impedance or insertion loss of the adjustable attenuation network.

Figure 16:
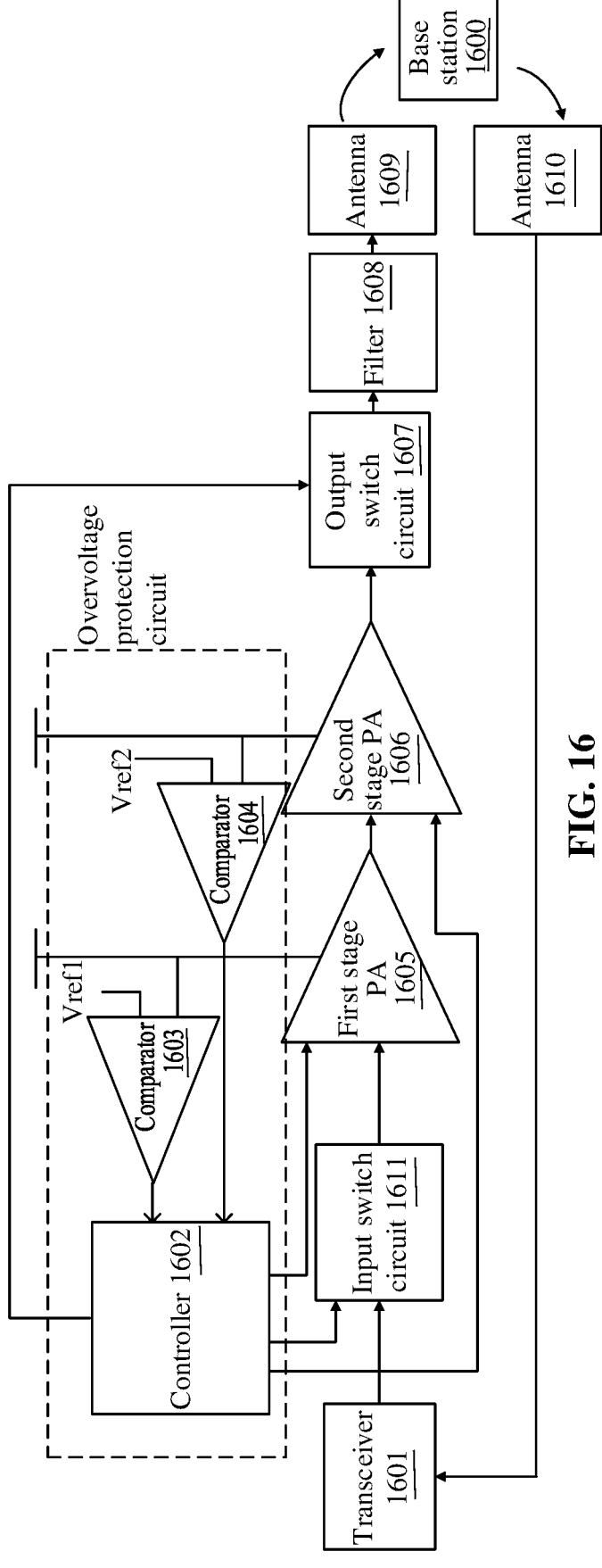
FIG. 16 is a schematic diagram of system compositional structures of an overvoltage protection circuit for a power amplifier according to an embodiment of the disclosure.

FIG. 16 is a schematic diagram of system compositional structures of an overvoltage protection circuit for a power amplifier according to an embodiment of the disclosure. As shown in FIG. 16, the system includes a base station 1600, a transceiver 1601, a controller 1602, a comparator 1603, a comparator 1604, a first stage PA 1605, a second stage PA 1606, an output switch circuit 1607, a filter 1608, an antenna 1609, an antenna 1610, and an input switch circuit 1611.

Here, the input switch circuit 1611 may be an implementation of the switch circuit.

Here, a first input end of the comparator 1603 is connected to a reference voltage Vref1, a second input end of the comparator 1603 is connected to a collector of a power transistor of the first stage PA 1605, and an output end of the comparator 1603 is connected to a first input end of the controller 1602. A first input end of the comparator 1604 is connected to a reference voltage Vref2, a second input end of the comparator 1604 is connected to a collector of a power transistor of the second stage PA 1606, and an output end of the comparator 1604 is connected to a second input end of the controller 1602. A first output end of the controller 1602 is connected to a bias current control input end of the first stage PA 1605, a second output end of the controller 1602 is connected to a bias current control input end of the second stage PA 1606, a third output end of the controller 1602 is connected to a control input end of the output switch circuit 1607, and a fourth output end of the controller 1602 is connected to a control input end of the input switch circuit 1611. The antenna 1610 is connected to an input end of the transceiver 1601, an output end of the transceiver 1601 is connected to a power input end of the first stage PA 1605 through the input switch circuit 1611, an output end of the first stage PA 1605 is connected to a power input end of the second stage PA 1606, an output end of the second stage PA 1606 is connected to a power input end of the output switch circuit 1607, an output end of the output switch circuit 1607 is connected to an input end of the filter 1608, and an output end of the filter 1608 is connected to the antenna 1609. Here, no line is connected between the base station 1600 and the antennas 1609 and 1610, however, the base station 1600 may receive a power signal fed back by the antenna 1609 and send control commands to the antenna 1610.

The comparator 1603 is configured to compare the reference voltage Vref1 with a power supply voltage source of the power transistor of the first stage PA 1605 to obtain a first comparison signal. The comparator 1604 is configured to compare the reference voltage Vref2 with a power supply voltage source of the power transistor of the second stage PA 1606 to obtain a second comparison signal. The controller 1602 is configured to generate a first current control signal, a second current control signal, an input switch control signal and an output switch control signal based on the first comparison signal and the second comparison signal. The first current control signal is configured to control a bias current of the first stage PA 1605. The second current control signal is configured to control a bias current of the second stage PA 1606. The input switch control signal is configured to control the input switch circuit 1611 to be turned on or off. The output switch control signal is configured to control the output switch circuit 1607 to be turned on or off. The base station 1600 is configured to receive a feedback power signal sent by the antenna 1609 and send generated control commands to the antenna 1610. The antenna 1610 is configured to receive the control commands sent by the base station 1600 and transmit the control commands to the transceiver 1601. The transceiver 1601 is configured to provide an input power signal with corresponding power to the first stage PA 1605, in response to the control commands. The input switch circuit 1611 is configured to turn on or off connection between the input power signal of the transceiver 1601 and the first stage PA 1605, in response to the input switch control signal. The first stage PA 1605 is configured to perform a first power amplification on the input power signal, in response to the first current control signal, and input a power signal after the first amplification to the second stage PA 1606. The second stage PA 1606 is configured to perform a second amplification on the power signal after the first amplification, in response to the second current control signal, and input a power signal after the second amplification to the output switch circuit 1607. The output switch circuit 1607 is configured to turn on or off connection between the second stage PA 1606 and the filter 1608. The filter 1608 is configured to implement switching of different frequency bands (communication modes). The antenna 1609 is configured to feed a power signal output by the filter 1608 back to the base station 1600. The antenna

1610 is configured to receive the control commands sent by the base station 1600 and send the control commands to the transceiver 1601.

Operation process includes the following operations. The overvoltage protection circuit compares the power supply voltage source of the power transistor of the first stage PA 1605 with the reference voltage Vref1 to obtain the first comparison signal, and compares the power supply voltage source of the power transistor of the second stage PA 1606 with the reference voltage Vref2 to obtain the second comparison signal. When an excessive voltage occurs on PA, the overvoltage protection circuit provides the first comparison signal and the second comparison signal to the controller 1602, and the controller 1602 generates the first current control signal and the second current control signal configured to control bias currents of the first stage PA 1605 and the second stage PA 1606 respectfully, and the input switch control signal and the output switch control signal configured to turn off the input switch circuit 1611 and the output switch circuit 1607 respectively, based on the first comparison signal and the second comparison signal. The first stage PA 1605 is offset to a lower DC operation point, or is directly turned off, in response to the first current control signal. The second stage PA 1606 is offset to a lower DC operation point, or is directly turned off, in response to the second current control signal. The input switch circuit 1611 turns off a path between the input power and the first stage PA 1605, in response to the input switch control signal. The output switch circuit 1607 turns off its path with the filter 1608, in response to the output switch control signal, thus achieving an effect of protecting PA.

Figure 17:
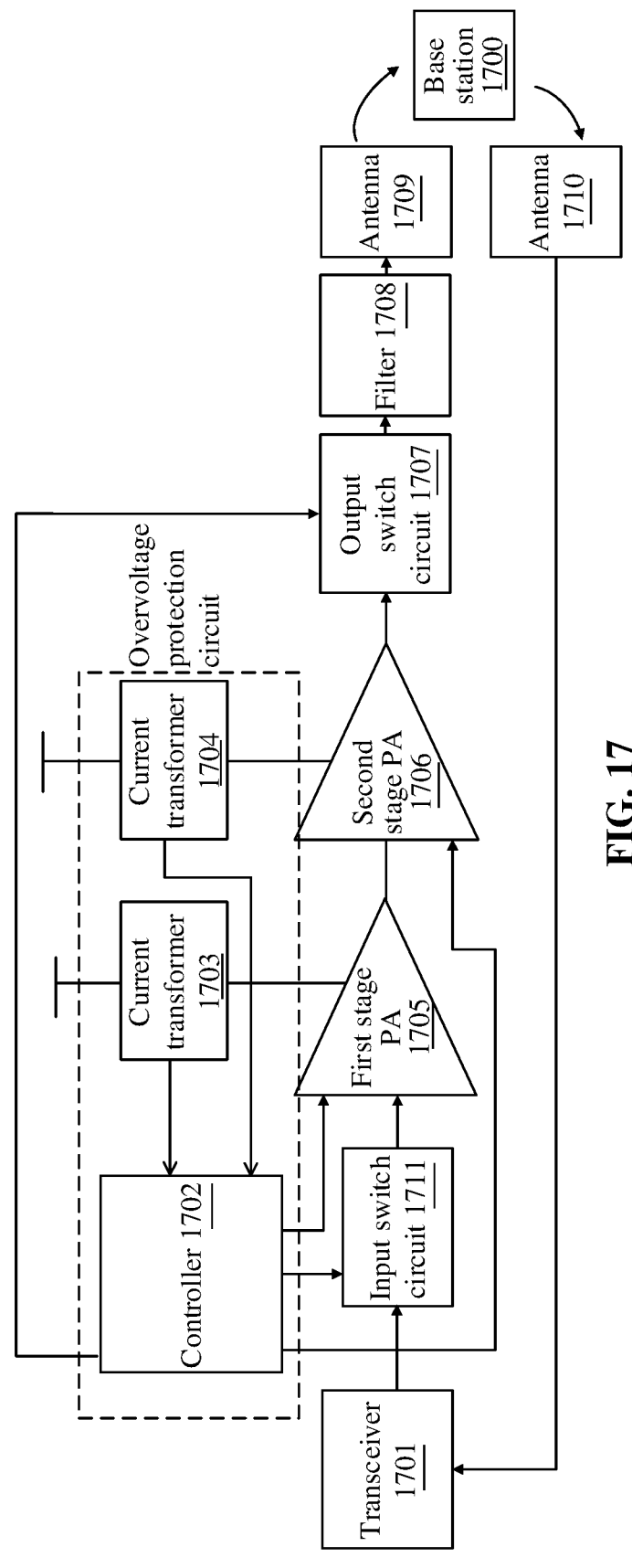
FIG. 17 is a schematic diagram of system compositional structures of an overcurrent protection circuit for a power amplifier according to an embodiment of the disclosure.

FIG. 17 is a schematic diagram of system compositional structures of an overcurrent protection circuit for a power amplifier according to an embodiment of the disclosure. As shown in FIG. 17, the system includes a base station 1700, a transceiver 1701, a controller 1702, a current transformer 1703, a current transformer 1704, a first stage PA 1705, a second stage PA 1706, an output switch circuit 1707, a filter 1708, an antenna 1709, an antenna 1710, and an input switch circuit 1711.

Here, the current transformer 1703 is arranged on a circuit connecting a collector of a power transistor of the first stage PA 1705 to a power supply voltage source, and the current transformer 1704 is arranged on a circuit connecting a collector of a power transistor of the second stage PA 1706 to a power supply voltage source. Output ends of the current transformer 1703 and the current transformer 1704 are connected to a first input end and a second input end of the controller 1702 respectively. A first output end of the controller 1702 is connected to a bias current control input end of the first stage PA 1705, a second output end of the controller 1702 is connected to a bias current control input end of the second stage PA 1706, a third output end of the controller 1702 is connected to a control input end of the output switch circuit 1707, and a fourth output end of the controller 1702 is connected to a control input end of the input switch circuit 1711. The antenna 1710 is connected to an input end of the transceiver 1701, an output end of the transceiver 1701 is connected to a power input end of the first stage PA 1705 through the input switch circuit 1711, an output end of the first stage PA 1705 is connected to a power input end of the second stage PA 1706, an output end of the second stage PA 1706 is connected to a power input end of the output switch circuit 1707, an output end of the output switch circuit 1707 is connected to an input end of the filter 1708, and an output end of the filter 1708 is connected to the antenna 1709. Here, no line is connected between the base station 1700 and the antennas 1709 and 1710, however, the base station 1700 may receive a power signal fed back by the antenna 1709 and send control commands to the antenna 1710.

The current transformer 1703 is configured to sense a current on the collector of the power transistor of the first stage PA 1705 to obtain a first current signal. The current transformer 1704 is configured to sense a current on the collector of the power transistor of the second stage PA 1706 to obtain a second current signal. The controller 1702 is configured to generate a first current control signal, a second current control signal, an input switch control signal and an output switch control signal based on the first current signal and the second current signal. The first current control signal is configured to control a bias current of the first stage PA 1705. The second current control signal is configured to control a bias current of the second stage PA 1706. The input switch control signal is configured to control the input switch circuit 1711 to be turned on or off. The output switch control signal is configured to control the output switch circuit 1707 to be turned on or off. The base station 1700 is configured to receive a feedback power signal sent by the antenna 1709 and send generated control commands to the antenna 1710. The antenna 1710 is configured to receive the control commands sent by the base station 1700 and transmit the control commands to the transceiver 1701. The transceiver 1701 is configured to provide input power with corresponding power to the first stage PA 1705, in response to the control commands. The input switch circuit 1711 is configured to turn on or off connection between the input power signal and the first stage PA 1705, in response to the input switch control signal. The first stage PA 1705 is configured to perform a first power amplification on input power, in response to the first current control signal, and input power after the first amplification to the second stage PA 1706. The second stage PA 1706 is configured to perform a second amplification on the power after the first amplification, in response to the second current control signal, and input power after the second amplification to the output switch circuit 1707. The output switch circuit 1707 is configured to turn on or off connection between the second stage PA 1706 and the filter 1708. The filter 1708 is configured to implement switching of different frequency bands (communication modes). The antenna 1709 is configured to feed a power signal output by the filter 1708 back to the base station 1700. The antenna 1710 is configured to receive the control commands sent by the base station 1700 and send the control commands to the transceiver 1701.

Operation process includes the following operations. The current transformer 1703 detects an operation current of the first stage PA 1705, and the current transformer 1704 detects an operation current of the second stage PA 1706. When an excessive current occurs on PA, the overcurrent protection circuit provides the operation current of the first stage PA 1705 and the operation current of the second stage PA 1706 to the controller 1702, and the controller 1702 generates the first current control signal and the second current control signal configured to control bias currents of the first stage PA 1705 and the second stage PA 1706 respectfully, and the input switch control signal and the output switch control signal configured to turn off the input switch circuit 1711 and the output switch circuit 1707 respectively, based on the operation current of the first stage PA 1705 and the operation current of the second stage PA 1706. The first stage PA 1705 is offset to a lower DC operation point, or is directly turned off, in response to the first current control signal. The second stage PA 1706 is offset to a lower DC operation point, or is directly turned off, in response to the second current control signal. The input switch circuit 1711 turns off a path between the input power and the first stage PA 1705, in response to the input switch control signal. The output switch circuit 1707 turns off its path with the filter 1708, in response to the output switch control signal, thus achieving an effect of protecting PA.

It may be known from the above embodiments that in the embodiments of the disclosure, an input switch circuit is added at the input end of PA, and the input switch circuit is set to be in a turn-on state by the input when PA operates normally. When overvoltage or overcurrent is enabled, the controller reduces the bias current of PA or turns off devices in the path of PA, while adjusts each of the input switch circuit and the output switch circuit to be in a turn-off state. Due to closed-loop control of the input power signal, the base station may control input power transmitted by the transceiver to be increased continuously. After overvoltage or overcurrent is recovered, the controller first controls recovery of bias currents of power transistors in the RF path so that RF devices in the path recover normal operation, and controls the output switch circuit to be turned on. After delaying a sufficiently long time, PA and other devices in the RF path reach their respective stable states (the output switch circuit is in a stable turn-on state), and the controller opens the input switch at this point. At this time, a steady state of the RF path has been established to ensure that incoming of the input signal may not burn out PA.

Figure 18:
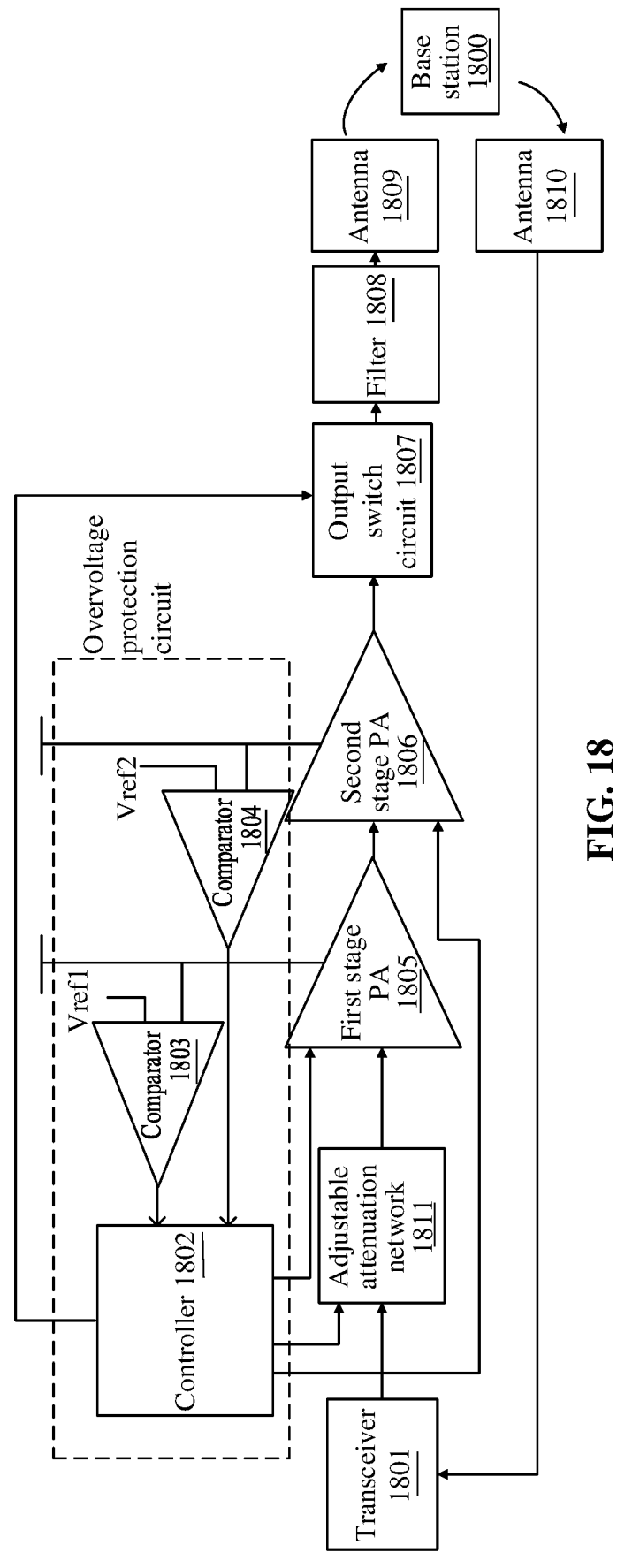
FIG. 18 is a schematic diagram of system compositional structures of another overvoltage protection circuit for a power amplifier according to an embodiment of the disclosure.

FIG. 18 is a schematic diagram of system compositional structures of an overvoltage protection circuit for a power amplifier according to an embodiment of the disclosure. As shown in FIG. 18, the system includes a base station 1800, a transceiver 1801, a controller 1802, a comparator 1803, a comparator 1804, a first stage PA 1805, a second stage PA 1806, an output switch circuit 1807, a filter 1808, an antenna 1809, an antenna 1810, and an adjustable attenuation network 1811.

Here, a first input end of the comparator 1803 is connected to a reference voltage Vref1, a second input end of the comparator 1803 is connected to a collector of a power transistor of the first stage PA 1805, and an output end of the comparator 1803 is connected to a first input end of the controller 1802. A first input end of the comparator 1804 is connected to a reference voltage Vref2, a second input end of the comparator 1804 is connected to a collector of a power transistor of the second stage PA 1806, and an output end of the comparator 1804 is connected to a second input end of the controller 1802. A first output end of the controller 1802 is connected to a bias current control input end of the first stage PA 1805, a second output end of the controller 1802 is connected to a bias current control input end of the second stage PA 1806, a third output end of the controller 1802 is connected to a control input end of the output switch circuit 1807, and a fourth output end of the controller 1802 is connected to a control input end of the adjustable attenuation network 1811. The antenna 1810 is connected to an input end of the transceiver 1801, an output end of the transceiver 1801 is connected to a power input end of the first stage PA 1805, an output end of the first stage PA 1805 is connected to a power input end of the second stage PA 1806, an output end of the second stage PA 1806 is connected to a power input end of the output switch circuit 1807, an output end of the output switch circuit 1807 is connected to an input end of the filter 1808, and an output end of the filter 1808 is connected to the antenna 1809. Here, no line is connected between the base station 1800 and the antennas 1809 and 1810, however, the base station 1800 may receive a power signal fed back by the antenna 1809 and send control commands to the antenna 1810.

The comparator 1803 is configured to compare the reference voltage Vref1 with a power supply voltage source of the power transistor of the first stage PA 1805 to obtain a first comparison signal. The comparator 1804 is configured to compare the reference voltage Vref2 with a power supply voltage source of the power transistor of the second stage PA 1806 to obtain a second comparison signal. The controller 1802 is configured to generate a first current control signal, a second current control signal, an adjustable attenuation network control signal and an output switch control signal based on the first comparison signal and the second comparison signal. The first current control signal is configured to control a bias current of the first stage PA 1805. The second current control signal is configured to control a bias current of the second stage PA 1806. The adjustable attenuation network control signal is configured to increase or decrease characteristic parameters of the adjustable attenuation network 1811. The output switch control signal is configured to control the output switch circuit 1807 to be turned on or off. The base station 1800 is configured to receive a feedback power signal sent by the antenna 1809 and send generated control commands to the antenna 1810. The antenna 1810 is configured to receive the control commands sent by the base station 1800 and transmit the control commands to the transceiver 1801. The transceiver 1801 is configured to provide input power with corresponding power to the first stage PA 1805, in response to the control commands. The adjustable attenuation network 1811 is configured to increase or decrease the characteristic parameters itself, in response to the adjustable attenuation network control signal, so as to decrease or increase a power signal input to the first stage PA 1805. The first stage PA 1805 is configured to perform a first power amplification on an input power signal, in response to the first current control signal, and input a power signal after the first amplification to the second stage PA 1806. The second stage PA 1806 is configured to perform a second amplification on the power signal after the first amplification, in response to the second current control signal, and input a power signal after the second amplification to the output switch circuit 1807. The output switch circuit 1807 is configured to turn on or off connection between the second stage PA 1806 and the filter 1808. The filter 1808 is configured to implement switching of different frequency bands (communication modes). The antenna 1809 is configured to feed a power signal output by the filter 1808 back to the base station 1800. The antenna 1810 is configured to receive the control commands sent by the base station 1800 and send the control commands to the transceiver 1801.

Operation process includes the following operations. The overvoltage protection circuit compares the power supply voltage source of the power transistor of the first stage PA 1805 with the reference voltage Vref1 to obtain the first comparison signal, and compares the power supply voltage source of the power transistor of the second stage PA 1806 with the reference voltage Vref2 to obtain the second comparison signal. When an excessive voltage occurs on PA, the overvoltage protection circuit provides the first comparison signal and the second comparison signal to the controller 1802, and the controller 1802 generates the first current control signal and the second current control signal configured to control bias currents of the first stage PA 1805 and the second stage PA 1806 respectfully, the adjustable attenuation network control signal configured to increase the characteristic parameters of the adjustable attenuation network 1811, and the output switch control signal configured to turn off the output switch circuit 1807, based on the first comparison signal and the second comparison signal. The first stage PA 1805 is offset to a lower DC operation point, or is directly turned off, in response to the first current control signal. The second stage PA 1806 is offset to a lower DC operation point, or is directly turned off, in response to the second current control signal. In the adjustable attenuation network 1811, the characteristic parameters of the adjustable attenuation network 1811 are increased in response to the adjustable attenuation network control signal, thus achieving an effect of protecting PA.

Figure 19:
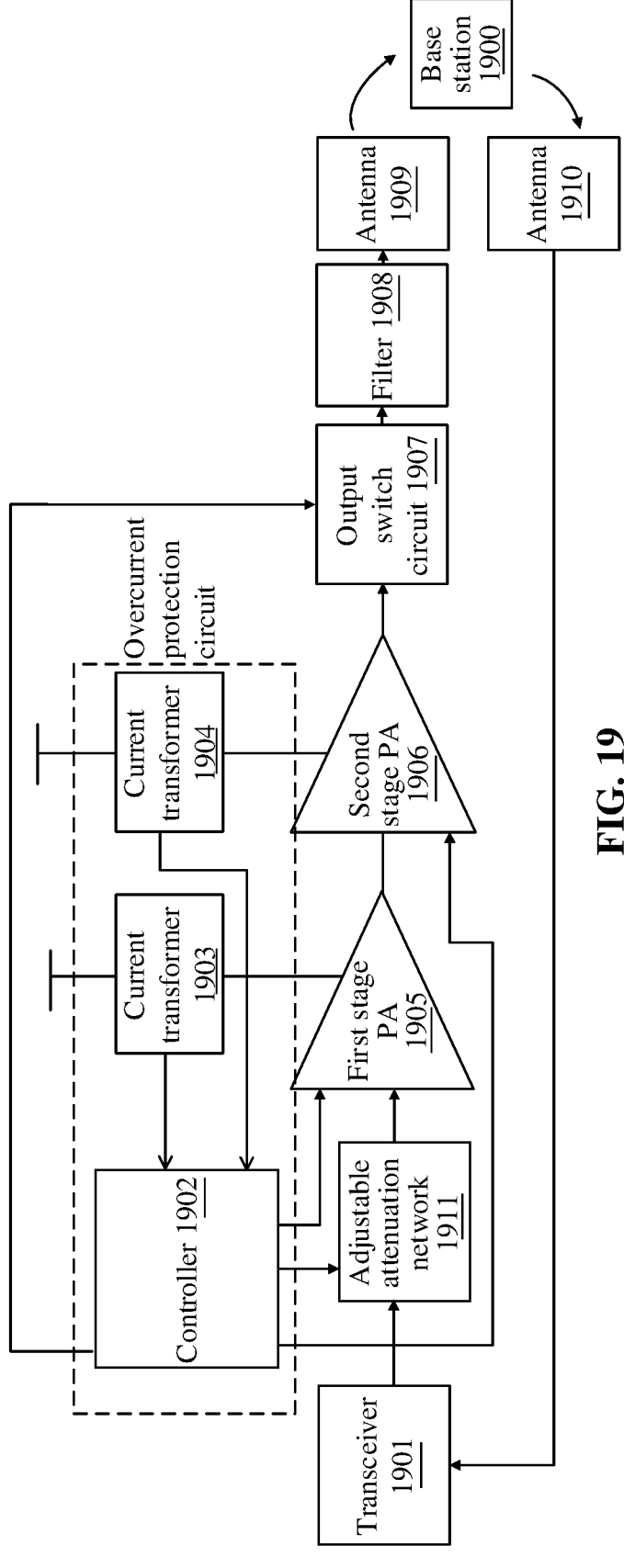
FIG. 19 is a schematic diagram of system compositional structures of another overcurrent protection circuit for a power amplifier according to an embodiment of the disclosure.

FIG. 19 is a schematic diagram of system compositional structures of an overcurrent protection circuit for a power amplifier according to an embodiment of the disclosure. As shown in FIG. 19, the system includes a base station 1900, a transceiver 1901, a controller 1902, a current transformer 1903, a current transformer 1904, a first stage PA 1905, a second stage PA 1906, an output switch circuit 1907, a filter 1908, an antenna 1909, an antenna 1910, and an adjustable attenuation network 1911.

Here, the current transformer 1903 is arranged on a circuit connecting a collector of a power transistor of the first stage PA 1905 to a power supply voltage source, and the current transformer 1904 is arranged on a circuit connecting a collector of a power transistor of the second stage PA 1906 to a power supply voltage source. Output ends of the current transformer 1903 and the current transformer 1904 are connected to a first input end and a second input end of the controller 1902 respectively. A first output end of the controller 1902 is connected to a bias current control input end of the first stage PA 1905, a second output end of the controller 1902 is connected to a bias current control input end of the second stage PA 1906, a third output end of the controller 1902 is connected to a control input end of the output switch circuit 1907, and a fourth output end of the controller 1902 is connected to a control input end of the adjustable attenuation network 1911. The antenna 1910 is connected to an input end of the transceiver 1901, an output end of the transceiver 1901 is connected to a power input end of the first stage PA 1905, a power output end of the first stage PA 1905 is connected to a power input end of the second stage PA 1906, a first output end of the second stage PA 1906 is connected to a power input end of the output switch circuit 1907, an output end of the output switch circuit 1907 is connected to an input end of the filter 1908, and an output end of the filter 1908 is connected to the antenna 1909. Here, no line is connected between the base station 1900 and the antennas 1909 and 1910, however, the base station 1900 may receive a power signal fed back by the antenna 1909 and send control commands to the antenna 1910.

The current transformer 1903 is configured to sense a current on the collector of the power transistor of the first stage PA 1905 to obtain a first current signal. The current transformer 1904 is configured to sense a current on the collector of the power transistor of the second stage PA 1906 to obtain a second current signal. The controller 1902 is configured to generate a first current control signal, a second current control signal, an adjustable attenuation network control signal and an output switch control signal based on the first current signal and the second current signal. The first current control signal is configured to control a bias current of the first stage PA 1905. The second current control signal is configured to control a bias current of the second stage PA 1906. The adjustable attenuation network control signal is configured to increase or decrease characteristic parameters of the adjustable attenuation network 1911. The output switch control signal is configured to control the output switch circuit 1907 to be turned on or off. The base station 1900 is configured to receive a feedback power signal sent by the antenna 1909 and send generated control commands to the antenna 1910. The antenna 1910 is configured to receive the control commands sent by the base station 1900 and transmit the control commands to the transceiver 1901. The transceiver 1901 is configured to provide input power with corresponding power to the first stage PA 1905, in response to the control commands. The adjustable attenuation network 1911 is configured to increase or decrease the characteristic parameters itself, in response to the adjustable attenuation network control signal, so as to decrease or increase a power signal input to the first stage PA 1905. The first stage PA 1905 is configured to perform a first power amplification on an input power signal, in response to the first current control signal, and input a power signal after the first amplification to the second stage PA 1906. The second stage PA 1906 is configured to perform a second amplification on the power signal after the first amplification, in response to the second current control signal, and input a power signal after the second amplification to the output switch circuit 1907. The output switch circuit 1907 is configured to turn on or off connection between the second stage PA 1906 and the filter 1908. The filter 1908 is configured to implement switching of different frequency bands (communication modes). The antenna 1909 is configured to feed a power signal output by the filter 1908 back to the base station 1900. The antenna 1910 is configured to receive the control commands sent by the base station 1900 and send the control commands to the transceiver 1901.

Operation process includes the following operations. The current transformer 1903 detects an operation current of the first stage PA 1905, and the current transformer 1904 detects an operation current of the second stage PA 1906. When an excessive current occurs on PA, the overcurrent protection circuit provides the operation current of the first stage PA 1905 and the operation current of the second stage PA 1906 to the controller 1902, and the controller 1902 generates the first current control signal and the second current control signal configured to control bias currents of the first stage PA 1905 and the second stage PA 1906 respectfully, the adjustable attenuation network control signal configured to increase or decrease the characteristic parameters of the adjustable attenuation network 1911, and the output switch control signal configured to turn off the output switch circuit 1907, based on the operation current of the first stage PA 1905 and the operation current of the second stage PA 1906. The first stage PA 1905 is offset to a lower DC operation point, or is directly turned off, in response to the first current control signal. The second stage PA 1906 is offset to a lower DC operation point, or is directly turned off, in response to the second current control signal. In the adjustable attenuation network 1911, the characteristic parameters of the adjustable attenuation network 1911 are decreased in response to the adjustable attenuation network control signal. The output switch circuit 1907 turns off its path with the filter 1908, in response to the output switch control signal, thus achieving an effect of protecting PA.

It may be known from the above embodiments that in the embodiments of the disclosure, an adjustable attenuation network is arranged between input and output ends of the first stage amplifier (multi-stage amplifiers) of PA (the adjustable attenuation network is connected in parallel with the first stage amplifier (multi-stage amplifiers), and the adjustable attenuation network is set to be in a low characteristic parameter state (a low impedance or insertion loss state) when PA operates normally. When overvoltage or overcurrent is enabled, the controller reduces the bias current of PA or turns off devices in the path of PA, while adjusts the adjustable attenuation network to be in a high characteristic parameter state (a high impedance or insertion loss state) so that the power signal sent by the transceiver may undergo large power attenuation after passing through the adjustable attenuation network (the power signal input to the power amplifier matches the operation current or voltage of the power amplifier), and the output switch circuit is adjusted to be in a turn-off state. Due to closed-loop control of the input power signal, the base station may control input power transmitted by the transceiver to be increased continuously. When the input power reaches a maximum power value of the transceiver, while the input power is not amplified by the multi-stage amplifiers, thus power value is still small, which may not burn out the power amplifier in an unstable state. After overvoltage or overcurrent is recovered, the controller first controls recovery of bias currents of power transistors in the RF path so that RF devices in the path recover normal operation, and controls the output switch circuit to be turned on. After delaying a sufficiently long time, PA and other devices in the RF path reach their respective stable states (the output switch circuit is in a stable turn-on state), and the controller adjusts the characteristic parameters of the adjustable attenuation network to be in a low characteristic parameter state, so that the power amplifier operates normally. At this time, since a steady state of the RF path has been established, the signal may be amplified through the normal path, which may not burn out PA.

The above descriptions of the embodiments tend to emphasize differences between the embodiments, and the same or similarities thereof may refer to each other, which may not be elaborated here for simplicity.

Methods disclosed in the method embodiments provided in the disclosure may be combined arbitrarily without conflict, to obtain new method embodiments.

Features disclosed in the product embodiments provided in the disclosure may be combined arbitrarily without conflict, to obtain new product embodiments.

Features disclosed in the method or phase shifter embodiments provided in the disclosure may be combined arbitrarily without conflict, to obtain new method or device embodiments.

The embodiments of the disclosure are described as above with reference to the drawings. However, the disclosure is not limited to the above embodiments. The above embodiments are only exemplary, rather than restrictive. Under inspiration of the disclosure, those of ordinary skill in the art may also make many forms without departing from the purpose of the disclosure and the scope of protection of the claims, all of which fall within the protection of the disclosure.

What is claimed is:

1. A protection circuit for a power amplifier, comprising a detection circuit, a controller and an input impedance adjustment circuit, the detection circuit provided with an input end connected to the power amplifier and an output end connected to an input end of the controller, and configured to detect an operation electrical signal of the power amplifier and generate a trigger electrical signal based on the operation electrical signal, a first output end of the controller connected to a base or a gate or a bias circuit of the power amplifier, and a second output end of the controller connected to a control input end of the input impedance adjustment circuit, an output end of the input impedance adjustment circuit connected to an input end of the power amplifier, the controller configured to generate a first control signal and a second control signal based on the trigger electrical signal, the first control signal configured to control a bias current or bias voltage of the power amplifier to reduce or recover a gain of the power amplifier, and the second control signal configured to adjust characteristic parameters of the input impedance adjustment circuit, and the input impedance adjustment circuit configured to decrease or increase input power of the power amplifier in response to the second control signal.

2. The protection circuit of claim 1, wherein when the first control signal recovers the gain of the power amplifier, the second control signal increases the input power of the power amplifier after a preset time elapses.

3. The protection circuit of claim 2, wherein the preset time is a time required for the power amplifier to be stable.

4. The protection circuit of claim 1, wherein the input impedance adjustment circuit comprises a switch circuit, the characteristic parameters of the input impedance adjustment circuit comprise an impedance of the switch circuit, the second output end of the controller is connected to a control input end of the switch circuit, an output end of the switch circuit is connected to the input end of the power amplifier, the second control signal is configured to adjust the impedance of the switch circuit, and the switch circuit is configured to adjust the impedance itself in response to the second control signal, to turn on or off the input power of the power amplifier, or decrease or increase the input power of the power amplifier.

5. The protection circuit of claim 1, wherein the input impedance adjustment circuit comprises an adjustable attenuation network, the characteristic parameters of the input impedance adjustment circuit comprise at least one of an impedance or insertion loss of the adjustable attenuation network, the second output end of the controller is connected to a control input end of the adjustable attenuation network, an output end of the adjustable attenuation network is connected to the input end of the power amplifier, the second control signal is configured to adjust at least the impedance or the insertion loss of the adjustable attenuation network, and the adjustable attenuation network is configured to adjust at least the impedance or the insertion loss itself in response to the second control signal, to decrease or increase the input power of the power amplifier.

6. The protection circuit of claim 1, wherein the detection circuit comprises a voltage detection circuit, the voltage detection circuit is provided with a first input end configured to obtain a reference voltage, a second input end connected to a feed end of the power amplifier and an output end connected to a first input end of the controller, and is configured to detect an operation voltage signal of the power amplifier and generate a trigger voltage signal based on the operation voltage signal, and the controller is configured to generate the first control signal and the second control signal based on the trigger voltage signal.

7. The protection circuit of claim 1, wherein the detection circuit comprises a current detection circuit, the current detection circuit is provided with an input end connected to a feed end of the power amplifier and an output end connected to a second input end of the controller, and is configured to detect an operation current signal of the power amplifier and generate a trigger current signal based on the operation current signal, and the controller is configured to generate the first control signal and the second control signal based on the trigger current signal.

8. The protection circuit of claim 6, wherein the power amplifier comprises a first stage amplifier and a second stage amplifier, the reference voltage comprises a first reference voltage and a second reference voltage, the voltage detection circuit comprises a first sub-detection circuit and a second sub-detection circuit, the trigger voltage signal comprises a first sub-trigger signal and a second sub-trigger signal, the first input end of the controller comprises a first sub-port and a second sub-port, and the first output end of the controller comprises a third sub-port and a fourth sub-port, the first sub-detection circuit is provided with a first input end configured to obtain the first reference voltage, a second input end connected to the first stage amplifier and an output end connected to the first sub-port, the second sub-detection circuit is provided with a first input end configured to obtain the second reference voltage, a second input end connected to the second stage amplifier and an output end connected to the second sub-port, the third sub-port is connected to a base or a gate or a bias circuit of the first stage amplifier, and the fourth sub-port is connected to a base or a gate or a bias circuit of the second stage amplifier, the first sub-detection circuit is configured to detect an operation voltage signal of the first stage amplifier and generate the first sub-trigger signal based on the operation voltage signal of the first stage amplifier and the first reference voltage, and the second sub-detection circuit is configured to detect an operation voltage signal of the second stage amplifier and generate the second sub-trigger signal based on the operation voltage signal of the second stage amplifier and the second reference voltage, and the controller is configured to generate a first sub-control signal based on the first sub-trigger signal to reduce or recover a gain of the first stage amplifier, generate a second sub-control signal based on the second sub-trigger signal to reduce or recover a gain of the second stage amplifier, and generate the second control signal based on the first sub-trigger signal and the second sub-trigger signal.

9. The protection circuit of claim 8, wherein the current detection circuit comprises a third sub-detection circuit and a fourth sub-detection circuit, the trigger current signal comprises a third sub-trigger signal and a fourth sub-trigger signal, and a second input end of the controller comprises a fifth sub-port and a sixth sub-port, the third sub-detection circuit is provided with an input end connected to the first stage amplifier and an output end connected to the fifth sub-port of the controller, the fourth sub-detection circuit is provided with an input end connected to the second stage amplifier and an output end connected to the sixth sub-port of the controller, the third sub-port is connected to the base or the gate or the bias circuit of the first stage amplifier, the fourth sub-port is connected to the base or the gate or the bias circuit of the second stage amplifier, and the second output end of the controller is connected to the control input end of the input impedance adjustment circuit, the third sub-detection circuit is configured to detect an operation current signal of the first stage amplifier and generate the third sub-trigger signal based on the operation current signal of the first stage amplifier, and the fourth sub-detection circuit is configured to detect an operation current signal of the second stage amplifier and generate the fourth sub-trigger signal based on the operation current signal of the second stage amplifier, and the controller is configured to generate the first sub-control signal based on the third sub-trigger signal to reduce or recover the gain of the first stage amplifier, generate the second sub-control signal based on the fourth sub-trigger signal to reduce or recover the gain of the second stage amplifier, and generate the second control signal based on the third sub-trigger signal and the fourth sub-trigger signal.

10. A protection method for a power amplifier, applied to the protection circuit of claim 1, the protection method comprising:

detecting, by a detection circuit, an operation electrical signal of the power amplifier, and generating, by the detection circuit, a trigger electrical signal based on the operation electrical signal;

generating, by a controller, a first control signal and a second control signal based on the trigger electrical signal, the first control signal configured to control a bias current or bias voltage of the power amplifier to reduce or recover a gain of the power amplifier, and the second control signal configured to adjust characteristic parameters of an input impedance adjustment circuit; and decreasing or increasing, by the input impedance adjustment circuit, input power of the power amplifier in response to the second control signal, to implement protection of the power amplifier.

11. The protection method of claim 10, wherein the operation electrical signal comprises an operation voltage signal, the trigger electrical signal comprises a trigger voltage signal, and detecting, by the detection circuit, the operation electrical signal of the power amplifier, and generating, by the detection circuit, the trigger electrical signal based on the operation electrical signal comprises: detecting, by the detection circuit, the operation voltage signal of the power amplifier; and determining, by the detection circuit, a result of comparing an amplitude of the operation voltage signal with an amplitude of a reference voltage as the trigger voltage signal, the first control signal comprising a first signal configured to reduce or cut off the bias current or bias voltage of the power amplifier, and the second control signal comprising a second signal configured to increase the characteristic parameters of the input impedance adjustment circuit, generating, by the controller, the first control signal and the second control signal based on the trigger electrical signal comprises:

determining, by the controller, whether the power amplifier is in an overvoltage state, according to the trigger voltage signal; and generating the first signal and the second signal, in response to determining that the power amplifier is in the overvoltage state, decreasing or increasing, by the input impedance adjustment circuit, the input power of the power amplifier in response to the second control signal, to implement protection of the power amplifier comprises: decreasing, by the input impedance adjustment circuit, the input power of the power amplifier in response to the second signal, to implement protection of the power amplifier.

12. The protection method of claim 11, wherein the first control signal further comprises a third signal configured to recover the bias current or bias voltage of the power amplifier, the second control signal further comprises a fourth signal configured to decrease the characteristic parameters of the input impedance adjustment circuit, and generating, by the controller, the first control signal and the second control signal based on the trigger electrical signal comprises: determining, by the controller, whether the power amplifier is in a normal voltage state, according to the trigger voltage signal; and generating the third signal, in response to determining that the power amplifier is in the normal voltage state, and delaying a preset time to generate the fourth signal, and decreasing or increasing, by the input impedance adjustment circuit, the input power of the power amplifier in response to the second control signal, to implement protection of the power amplifier comprises: increasing, by the input impedance adjustment circuit, the input power of the power amplifier in response to the fourth signal, to recover operation of the power amplifier.

13. The protection method of claim 12, wherein the operation electrical signal comprises an operation current signal, the trigger electrical signal comprises a trigger current signal, and detecting, by the detection circuit, the operation electrical signal of the power amplifier, and generating, by the detection circuit, the trigger electrical signal based on the operation electrical signal comprises: detecting, by the detection circuit, the operation current signal of the power amplifier; and determining, by the detection circuit, the operation current signal as the trigger current signal, and generating, by the controller, the first control signal and the second control signal based on the trigger electrical signal comprises:

determining, by the controller, whether the power amplifier is in an overcurrent state, according to the trigger current signal; and generating the first signal and the second signal, in response to determining that the power amplifier is in the overcurrent state.

14. The protection method of claim 13, wherein generating, by the controller, the first control signal and the second control signal based on the trigger electrical signal comprises:

determining, by the controller, whether the power amplifier is in a normal current state, according to the trigger current signal; and generating the third signal, in response to determining that the power amplifier is in the normal current state, and delaying a preset time to generate the fourth signal, decreasing or increasing, by the input impedance adjustment circuit, the input power of the power amplifier in response to the second control signal, to implement protection of the power amplifier comprises:

increasing, by the input impedance adjustment circuit, the input power of the power amplifier in response to the fourth signal, to recover operation of the power amplifier.

15. The protection method of claim 10, wherein the input impedance adjustment circuit comprises a switch circuit, the characteristic parameters of the input impedance adjustment circuit comprise an impedance of the switch circuit; or, the input impedance adjustment circuit comprises an adjustable attenuation network, the characteristic parameters of the input impedance adjustment circuit comprise at least an impedance or insertion loss of the adjustable attenuation network.

\* \* \* \* \*